(12) United States Patent
Watanabe et al.

(10) Patent No.: US 11,160,314 B2
(45) Date of Patent: Nov. 2, 2021

(54) BATTERY UNIT INSPECTION DEVICE AND BATTERY UNIT INSPECTION SYSTEM

(71) Applicant: Japan Tobacco Inc., Tokyo (JP)

(72) Inventors: Tomoichi Watanabe, Tokyo (JP); Hidenori Muramoto, Tokyo (JP); Kenta Mitsuchi, Tokyo (JP); Toshiki Kudo, Tokyo (JP); Takaya Takahashi, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 239 days.

(21) Appl. No.: 16/547,255

(22) Filed: Aug. 21, 2019

(65) Prior Publication Data
US 2019/0373958 A1    Dec. 12, 2019

Related U.S. Application Data

(63) Continuation of application No. PCT/JP2018/018197, filed on May 10, 2018.

(30) Foreign Application Priority Data

May 12, 2017 (WO) .................. PCT/JP2017/018102

(51) Int. Cl.
*G01R 31/00* (2006.01)
*A24F 40/80* (2020.01)
(Continued)

(52) U.S. Cl.
CPC .......... *A24F 40/80* (2020.01); *G01R 31/3644* (2013.01); *H01M 10/4285* (2013.01); *H01M 10/48* (2013.01); *H01M 2220/30* (2013.01)

(58) Field of Classification Search
USPC .......................... 324/426, 434; 320/116, 118
See application file for complete search history.

(56) References Cited

U.S. PATENT DOCUMENTS

| 6,134,948 A | 10/2000 | Fuchigami et al. |
| 2002/0166802 A1* | 11/2002 | Jung .................. H01M 10/052 209/575 |

(Continued)

FOREIGN PATENT DOCUMENTS

| CN | 204129073 U | 1/2015 |
| JP | 2000-39377 A | 2/2000 |

(Continued)

OTHER PUBLICATIONS

Taiwanese Office Action and Search Report for Taiwanaese Application No. 107116103, dated Dec. 18, 2019, with English translation.
(Continued)

*Primary Examiner* — Vincent Q Nguyen
(74) *Attorney, Agent, or Firm* — Birch, Stewart, Kolasch & Birch, LLP

(57) ABSTRACT

An inspection device is an inspection device for a battery unit for a smoking article having a battery embedded therein, the battery unit including a suction detection part that detects negative pressure in the battery unit, the inspection device including: a suction path to be connected to the suction detection part through a suction port, a suction source disposed in the suction path, a control unit that inspects operation of the battery unit on the basis of the negative pressure detected by the suction detection part, by operating the suction source to suck the suction detection part through the suction path.

33 Claims, 19 Drawing Sheets

(51) Int. Cl.
    *G01R 31/36* (2020.01)
    *H01M 10/42* (2006.01)
    *H01M 10/48* (2006.01)

(56) References Cited

U.S. PATENT DOCUMENTS

| | | |
|---|---|---|
| 2013/0192615 A1 | 8/2013 | Tucker et al. |
| 2014/0300480 A1 | 10/2014 | Xiang |
| 2015/0223522 A1 | 8/2015 | Ampolini et al. |
| 2015/0351457 A1* | 12/2015 | Liu ................ A24F 40/485 131/328 |
| 2017/0238605 A1 | 8/2017 | Matsumoto et al. |
| 2017/0238608 A1 | 8/2017 | Matsumoto et al. |
| 2019/0037926 A1* | 2/2019 | Qiu ................ A24F 40/485 |

FOREIGN PATENT DOCUMENTS

| | | |
|---|---|---|
| JP | 2015-505474 A | 2/2015 |
| JP | 2016-521356 A | 7/2016 |
| JP | 2017-506512 A | 3/2017 |
| TW | 201616989 A | 5/2016 |
| TW | 201616990 A | 5/2016 |

OTHER PUBLICATIONS

International Search Report, issued in PCT/JP2018/018197, dated Aug. 7, 2018.

* cited by examiner

BATTERY UNIT INSPECTION DEVICE AND BATTERY UNIT INSPECTION SYSTEM

CROSS REFERENCE TO RELATED APPLICATIONS

This application is a Continuation of PCT International Application No. PCT/JP2018/018197, filed on May 10, 2018, which claims priority under 35 U.S.C. 119(a) to Patent Application No. PCT/JP2017/018102, filed in Japan on May 12, 2017, all of which are hereby expressly incorporated by reference into the present application.

TECHNICAL FIELD

The present invention relates to a battery unit inspection device, and a battery unit inspection system, and more particularly to a battery unit inspection device and a battery unit inspection system for a smoking article having a battery embedded therein.

BACKGROUND ART

Patent Document 1 discloses a tester that tests a smoke amount of an electronic cigarette. This tester includes a smoke collecting device that collects smoke of the electronic cigarette, a detector that detects transparency of smoke collected by the smoke collecting device, and a control device that outputs warning and the like on the basis of a detection result of the smoke detected by the detector.

Patent Document 2 discloses a battery holder used in a battery measuring device of an electronic cigarette. By using this battery holder, positive and negative electrodes of a plurality of batteries of the electronic cigarette can be collectively fixed.

PRIOR ART DOCUMENT

Patent Document

Patent Document 1: National Publication of International Patent Application No. 2016-521356
Patent Document 2: Specification of Chinese Utility Model No. 204129073

SUMMARY OF THE INVENTION

Problems to be Solved by the Invention

Generally, a smoking article having a battery unit includes an atomizer unit. The atomizer unit is connected to the battery unit, and atomizes an aerosol source without combustion by electric power of a battery. Such a battery unit sometimes includes a suction detection part that detects negative pressure which acts on the battery unit by smoking, in addition to an electric terminal electrically connected the battery. In the battery unit, electric power is supplied from the battery to the atomizer unit on the basis of the detection of the negative pressure in the suction detection part, and the aerosol source is atomized by the electric power.

The tester of Patent Document 1 is a device that inspects an atomization amount of an aerosol source in a state of a smoking article obtained by integrating a battery unit and an atomizer unit, that is, an aerosol cigarette. This tester cannot inspect the battery unit independently, and therefore in a case in which failure is found in the smoking article in the process of the inspection, it is difficult to determine whether the cause is the battery unit or the atomizer unit. Therefore, there is a risk that inspection efficiency and inspection precision of the battery unit are lowered.

On the other hand, the battery holder of Patent Document 2 is merely an assisting jig for inspecting a plurality of battery units. Even when this battery holder is used, only the battery can be inspected, and therefore in a case in which the battery unit includes not only the battery, but also the suction detection part, the suction detection part needs to be inspected by another device separately. Therefore, also in this case, there is a risk that the inspection efficiency and the inspection precision of the battery unit are lowered.

The present invention has been made in view of such circumferences, and an object of the invention is to provide a battery unit inspection device and a battery unit inspection system enabling improvement of inspection efficiency and inspection precision of a battery unit for a smoking article.

Means for Solving the Problems

In order to achieve the above object, a battery unit inspection device of the present invention is an inspection device for a battery unit for a smoking article having a battery embedded therein, the battery unit including a suction detection part that detects negative pressure in the battery unit, the inspection device including: a suction path to be connected to the suction detection part through a suction port; a suction source disposed in the suction path; and a control unit that inspects operation of the battery unit on the basis of the negative pressure detected by the suction detection part, by operating the suction source to suck the suction detection part through the suction path.

On the other hand, a battery unit inspection system of the present invention includes: a carrying-in station in which a tray on which a plurality of the battery units are disposed is carried; a conveyor that carries a holder for storing the battery units; a first picking station that picks the battery units disposed on the tray, and stores the picked battery units in the holder; an inspection station that connects the inspection device to the battery units stored in the holder during carrying by the conveyor, and collectively inspects the battery units every holder; and a second picking station that picks and carries out the battery units from the holder in accordance with an inspection result of the battery units in the inspection station.

Advantageous Effects of the Invention

According to a battery unit inspection device and a battery unit inspection system of the present invention, it is possible to improve inspection efficiency and inspection precision of a battery unit for a smoking article.

MODE FOR CARRYING OUT THE INVENTION

Figure 1:
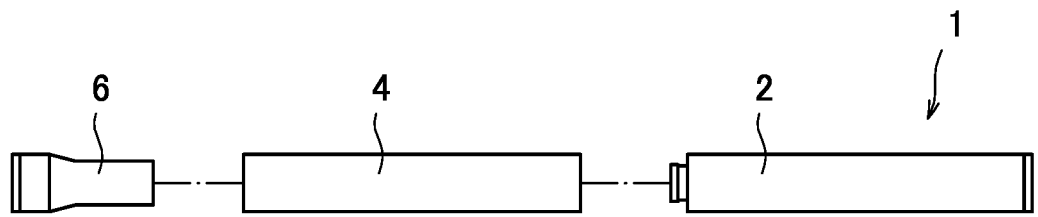
FIG. 1 is a side view illustrating a smoking article including a battery unit to be inspected by an inspection device according to each of embodiments of the present invention, the smoking article being separated into other units.

Hereinafter, an inspection device according to each of embodiments of the present invention will be described with reference to the drawings. First, a configuration of a smoking article 1 including a battery unit 2 to be inspected by the inspection device of each embodiment will be described with reference to FIG. 1 to FIG. 7. As illustrated FIG. 1, the battery unit 2 to be inspected by the inspection device of this embodiment composes the smoking article 1. This smoking article 1 is a noncombustible type flavor suction device obtained by connecting the battery unit 2, an atomizer unit 4, and a capsule unit 6. The battery unit 2, and the capsule unit 6 are detachably connected to respective both ends of the atomizer unit 4.

Figure 2:
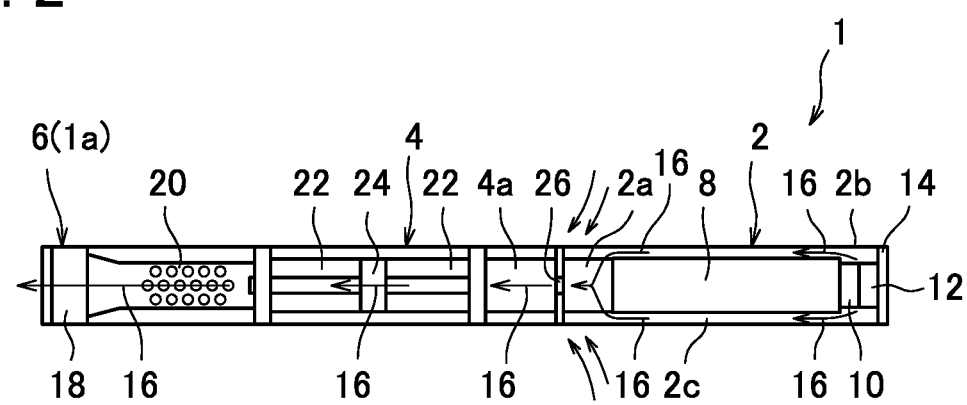
FIG. 2 is a diagram illustrating a structure and a function of the smoking article.

As illustrated FIG. 2, the battery unit 2 has a battery 8 embedded therein, and has a connecting part 2a with the atomizer unit 4 at an end. The battery unit 2 has a cylindrical housing 2b. The battery 8, a pressure sensor (suction detection part) 10, a control board 12, and the like are disposed in order from the connecting part 2a side in the housing 2b, and an LED (light-emitting device) 14 is provided at a second end of the battery unit 2. A clearance 2c is secured from the connecting part 2a to the pressure sensor 10 between the housing 2b and the battery 8. This clearance 2c forms a part of a suction path 16 of the smoking article 1 illustrated by arrows in FIG. 2.

The capsule unit 6 has a first end having a filter 18, has a second end having a mesh formed by fine holes, and has a flavor source 20 and the like disposed therein. The filter 18 forms a suction end 1a of the smoking article 1. The flavor source 20 is constituted by storing at least one of cut tobacco, compact obtained by forming a tobacco raw material into a granular or sheet-like form, a plant other than tobacco, other flavoring agent, and the like without causing leakage possibility to the outside. A user sucks the smoking article 1 at the suction end 1a, so that a component of the flavor source 20 obtained at the time of ventilation in the flavor source 20 can be taken through the filter 18.

The atomizer unit 4 has a first end having a connecting part 4a connected to the battery unit 2, and has a second end connected to the capsule unit 6 fitted therein. Inside the atomizer unit 4, an aerosol source 22, a heat source 24, and the like are disposed in order from the connecting part 4a side. The connecting part 4a of the atomizer unit 4 is connected to the connecting part 2a of the battery unit 2, so that the atomizer unit 4 and the battery unit 2 are electrically connected to each other, and an air introducing port 26 is formed in each of the connecting parts 2a, 4a. The air introducing port 26 will be described later.

In the smoking article 1 thus configured, a user sucks (puffs) from the suction end 1a, so that a flow of air from the air introducing port 26 to the heat source 24 through the connecting part 4a is allowed as illustrated the arrows. The aerosol source 22 is supplied to the heat source 24 by a wick (not illustrated), atomized by the heat source 24, and becomes aerosol. The aerosol sequentially passes through the flavor source 20 and the filter 18 with the flow of the air to be supplied to the user. At this time, air in the battery unit 2 is sucked to the atomizer unit 4 side through the clearance 2c as illustrated in the arrows, and therefore the pressure sensor 10 detects negative pressure in the battery unit 2.

When the pressure sensor 10 detects the negative pressure in the battery unit 2, the detect information is transmitted to the control board 12. The control board 12 supplies electric power to the atomizer unit 4 side through the battery 8, the connecting part 2a, and the connecting part 4a sequentially to operate the heat source 24, and further lights the LED 14 through the battery 8. Thus, the LED 14 lights in a predetermined color on the basis of the negative pressure detected by the pressure sensor 10, so that the user can recognize that the smoking article 1 is being used.

Furthermore, the LED 14 changes color in accordance with various modes of the battery 8 to light or flicker. The frequency of detection of the negative pressure detected by the pressure sensor 10 is counted as the frequency of puffing of the smoking article 1 by the user, and recorded in the control board 12. When the recorded frequency of puffing reaches a predetermined frequency of puffing or more, the control board 12 changes the color of the LED 14, or flickers, so that the user recognizes that the frequency of puffing reaches the predetermined frequency or more.

Figure 3:
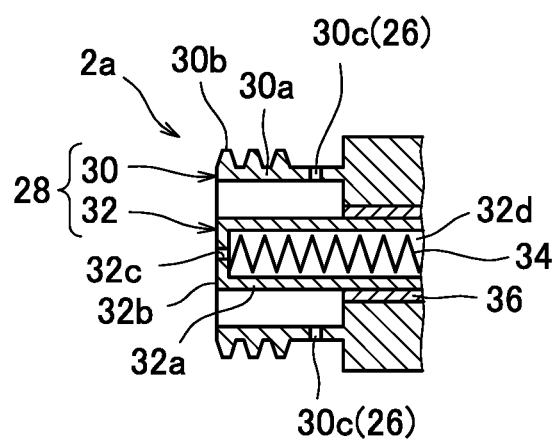
FIG. 3 is a sectional view of a connecting part of the battery unit.
Figure 4:
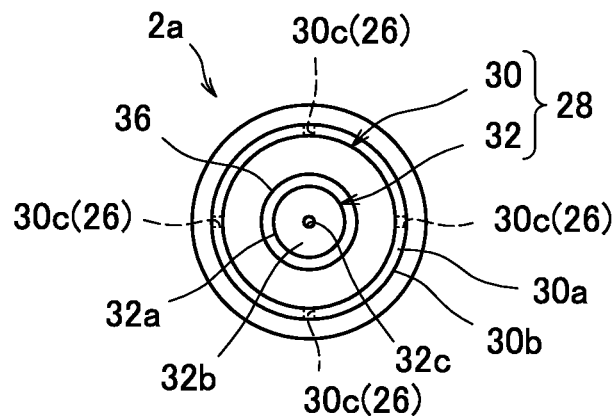
FIG. 4 is a front view of the connecting part of the battery unit.

As illustrated in FIG. 3 and FIG. 4, the connecting part 2a of the battery unit 2 has an electric terminal 28 electrically connected to the battery 8. The electric terminal 28 is composed of a cylindrical outer terminal 30, and a bottomed cylindrical inner terminal 32 disposed inside the outer terminal 30. The outer terminal 30 is, for example, a positive electrode as one electrode of the electric terminal 28, and is formed with a screw 30b on an outer periphery of a cylindrical wall 30a of the outer terminal 30.

The cylindrical wall 30a is formed with four through holes 30c. These through holes 30c function as the aforementioned air introducing port 26 in the suction path 16. The inner terminal 32 is, for example, a negative electrode as the other electrode of the electric terminal 28, and is disposed such that the bottom wall 32b of the inner terminal 32 is directed so as to protrude toward the atomizer unit 4 side. As illustrated is FIG. 3, a space 32d is formed inside a cylindrical wall 32a of the inner terminal 32, and the space 32d is communicated with the clearance 2c, and forms one portion of the suction path 16.

The bottom wall 32b of the inner terminal 32 is formed with a through hole 32c, and the space 32d is communicated with the outside of the battery unit 2 through the through hole 32c. As illustrated in FIG. 3, a spring 34 is disposed in the space 32d. In the spring 34, a first end fixed to a pedestal (not illustrated), and a second end presses and urges the bottom wall 32b of the inner terminal 32 toward the outside in the axial direction of the battery unit 2, and allows movement in the axial direction of the inner terminal 32. A cylindrical electric insulating material 36 is disposed between the outer terminal 30 and the inner terminal 32, and the electric insulating material 36 prevents an electric short circuit between the outer and inner terminals 30, 32.

Figure 5:
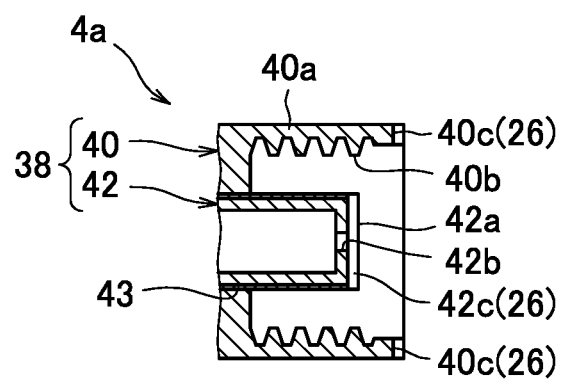
FIG. 5 is a sectional view of a connecting part of an atomizer unit.
Figure 6:
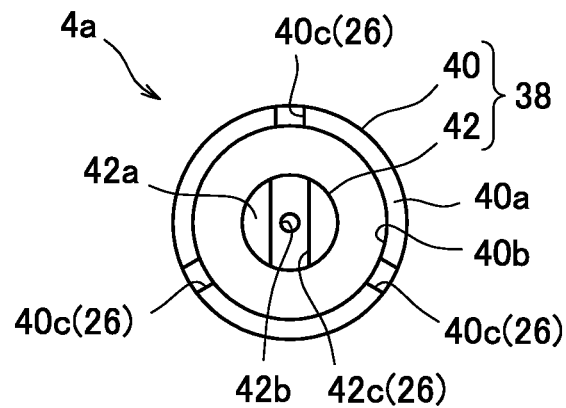
FIG. 6 is a front view of the connecting part of the atomizer unit.

As illustrated in FIG. 5 and FIG. 6, the connecting part 4a of the atomizer unit 4 has an electric terminal 38 electrically connected to the heat source 24. The electric terminal 38 is composed of a cylindrical outer terminal 40, and a bottomed cylindrical inner terminal 42 disposed inside the outer terminal 40. The outer terminal 40 is connected to the outer terminal 30 of the battery unit 2, and is formed with a screw 40b on an inner periphery of a cylindrical wall 40a of the outer terminal 40. Additionally, three rectangular cutouts 40c are formed in an end of the cylindrical wall 40a. These cutouts 40c function as the aforementioned air introducing port 26 in the suction path 16.

The inner terminal 42 is connected to the inner terminal 32 of the battery unit 2, and is disposed such that a bottom wall 42a of the inner terminal 42 is directed so as to protrude toward the battery unit 2. A through hole 42b is formed in the bottom wall 42a of the inner terminal 42, and a linear cutout 42c is formed in a region including an opening of the through hole 42b in the bottom wall 42a. This cutout 42c functions as the air introducing port 26 in the suction path 16. A cylindrical electric insulating material 43 is disposed between the outer terminal 40 and the inner terminal 42, and the electric insulating material 43 prevents an electric short circuit between the outer and inner terminals 40, 42.

Figure 7:
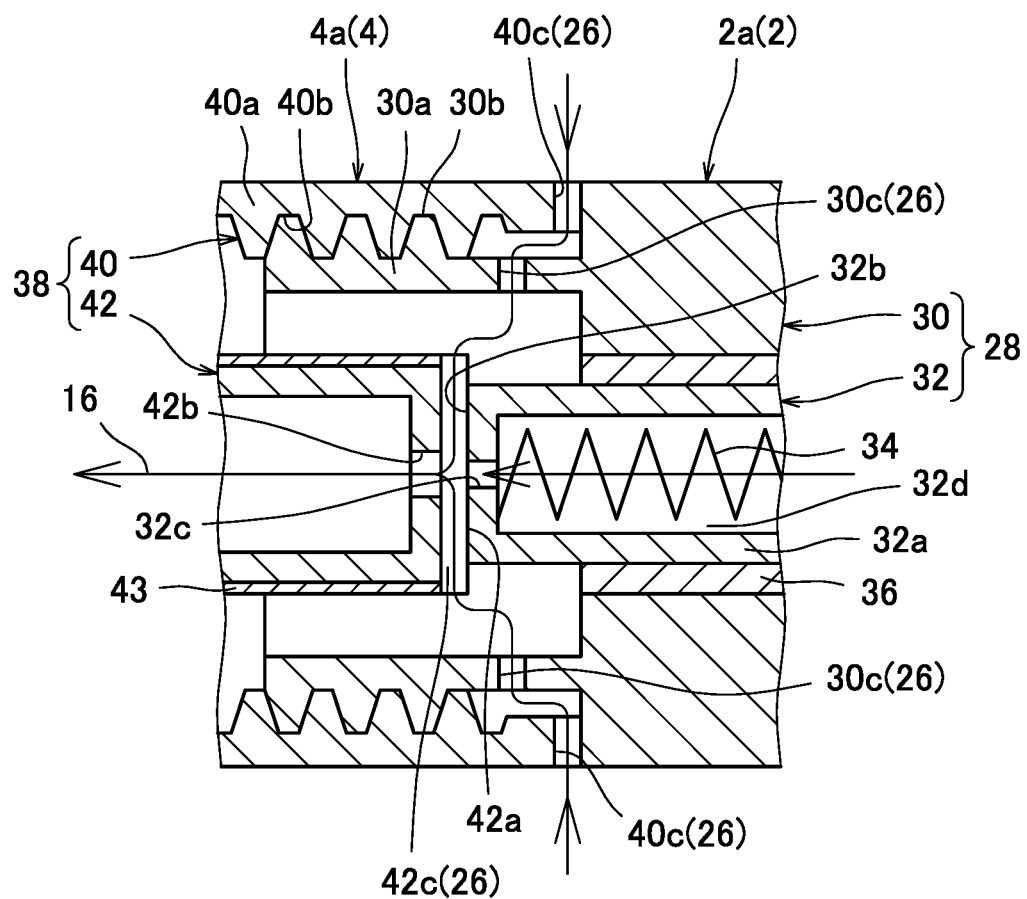
FIG. 7 is a sectional view of a state in which the connecting part of the battery unit and the connecting part of the atomizer unit are connected to each other.

As illustrated in FIG. 7, the screw 30b of the outer terminal 30 and the screw 40b of the outer terminal 40 are screwed to each other, so that the connecting part 2a of the battery unit 2 and the connecting part 4a of the atomizer unit 4 are connected to each other. At this time, the outer terminal 30 of the battery unit 2 is connected to the outer terminal 40 of the atomizer unit 4, and the inner terminal 32 of the battery unit 2 is pressed by the inner terminal 42 of the atomizer unit 4. The inner terminal 32 of the battery unit 2 is pressed to the inside in the axial direction of the battery unit 2 against elastic force of the spring 34, and the inner terminals 32, 42 come into contact with the bottom walls 32b, 42a respectively.

In this state, at the time of suction from the suction end 1a, the respective through holes 32c, 42b of the battery unit 2 and the atomizer unit 4 are communicated with the clearance 2c of the battery unit 2 and the heat source 24 of the atomizer unit 4, as illustrated by arrows in FIG. 7. Consequently, the suction path 16 of the smoking article 1 communicated from the clearance 2c of the battery unit 2 to the flavor source 20 of the capsule unit 6 and the suction end 1a through the heat source 24 is formed.

At the time of suction from the suction end 1a, as illustrated by arrows in FIG. 7, air outside the smoking article 1 sequentially passes through the three cutouts 40c of the atomizer unit 4, the four through holes 30c of the battery unit 2, and the one cutout 42c of the atomizer unit 4, all of which function as the air introducing port 26, and thereafter the air is introduced from the through hole 42b of the atomizer unit 4 to the suction path 16. Therefore, at the time of suction from the suction end 1a, adequate negative pressure is generated in the clearance 2c of the battery unit 2, and the pressure sensor 10 detects this negative pressure.

When the pressure sensor 10 detects negative pressure, the LED 14 lights, and the heat source 24 operates. The LED 14 lights, so that a user can recognize that the smoking article 1 is being used. Additionally, the heat source 24 operates, so that the aerosol source 22 is atomized to generate aerosol without combustion. This aerosol is supplied to the user from the suction end 1a in a state in which the component of the flavor source 20 is contained by ventilation in the flavor source 20 with suction.

First Embodiment

Hereinafter, an inspection device 100 according to a first embodiment for the battery units 2 will be described with reference to FIG. 8 to FIG. 13. The inspection device 100 includes suction paths 44 illustrated by arrows in FIG. 8. In each suction path 44, an adapter 46, a solenoid valve 48, a massflow controller (rate controller) 50 (hereinafter, also referred to as an MFC), and vacuum pumps (suction sources) 52 are disposed in order from the battery unit 2 side to be set in the inspection device 100.

In the inspection device 100, optical sensors 54 are disposed above the battery units 2, and a control unit 56 electrically connected to the adapters 46, the solenoid valves 48, the MFCs 50, the vacuum pumps 52, and the optical sensors 54 is provided. The adapters 46, the solenoid valves 48, the MFCs 50, and the vacuum pumps 52 are fixed to a fixing base 57, and sequentially connected by air pipe tubes 44a, so that the suction paths 44 are formed.

Each adapter 46 has a connecting part 46a connected to the connecting part 2a of the battery unit 2. This connecting part 46a is electrically connected to the battery 8, and communicated with the pressure sensor 10 through the clearance 2c of the battery unit 2 at the time of inspection of the battery unit 2, although a structure of each adapter 46 will be described in detail. Each suction path 44 is formed when a valve body of the solenoid valve 48 is driven in the communicating direction of the suction path 44 (hereinafter referred to as opening driving) in a state in which the vacuum pump 52 is started. The MFC 50 adjusts a suction flow rate of the suction path 44 in accordance with an inspection item at the time of inspection. Each optical sensor 54 detects a light emission mode (flicker, color, and the like) of the LED 14 by image recognition.

The control unit 56 can control operation of at least the solenoid valves 48, the vacuum pumps 52, and the MFCs 50 on the basis of detection data of the adapters 46, the MFCs 50, and the optical sensors 54, adjust inspection conditions of the battery units 2, and inspect the operation of the battery units 2. Additionally, the control unit 56 has a function of resetting the frequency of detection of negative pressure by each pressure sensor 10 recorded in the control board 12, by switching into a load circuit described below, and shifting each battery unit 2 to a reset mode (reset function). Consequently, each battery unit 2 is brought into a shippable state.

Sliders 60 are installed in the fixing base 57 through the linear guide 58. The battery units 2 are detachably held in the sliders 60 such that the connecting parts 2a face the connecting parts 46a of the adapters 46. A clamp 62 having a horizontal push toggle mechanism is installed in respective one ends of the sliders 60.

The clamp 62 has a handle 62a, and a pressing part 62b that presses the sliders 60 in accordance with operation of the handle 62a. An inspection worker operates the handle 62a, so that the sliders 60 are pressed by the pressing part 62b to move in the arrow direction illustrated in FIG. 8. Consequently, the connecting parts 2a of the battery units 2 are connected to the connecting parts 46a of the adapters 46.

Figure 9:
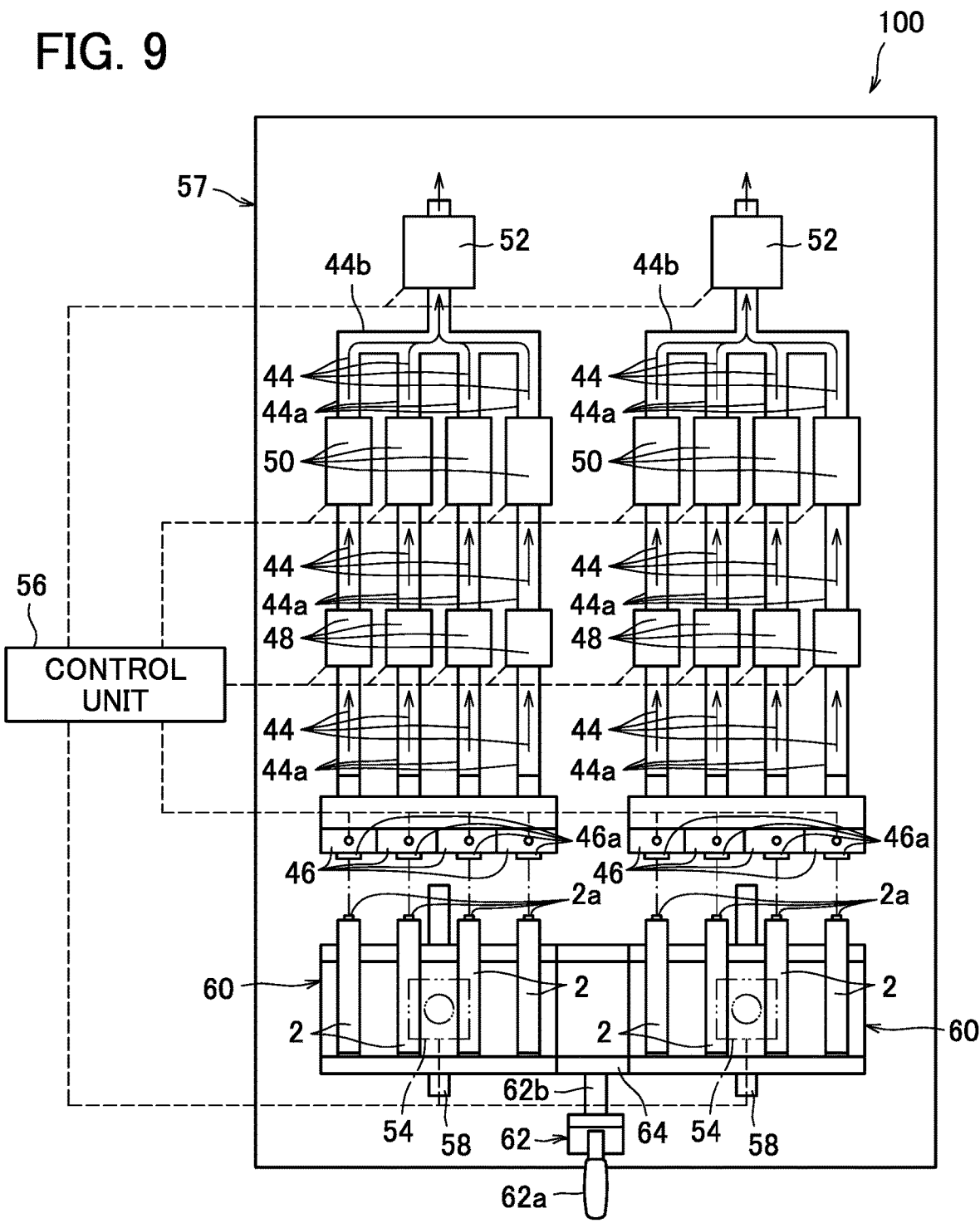
FIG. 9 is a view of the inspection device of FIG. 8 viewed from an upper side.

As illustrated in FIG. 9, in the case of this embodiment, the two sliders 60 are provided in the inspection device 100, and the sliders 60 are coupled by a coupling member 64 extending so as to intersect in the moving direction. The pressing part 62b of the clamp 62 is located in the coupling member 64 so as to enable contact, and the handle 62a is operated, so that the pressing part 62b moves the two sliders 60 at the same time.

Four battery units 2 are fixed to each slider 60, and eight adapters 46 corresponding to a total of the eight battery units 2 are fixed to the fixing base 57. The four battery units 2 are detachably held in each slider 60 with postures directing respective connecting part 2a in the same direction. On the other hand, the eight adapters 46 are unitized into four each, and these connecting parts 46a are fixed to the fixing base 57 with postures directed to face the connecting parts 2a of the battery units 2.

The suction paths 44 extend from the eight adapters 46, and the solenoid valves 48 and the MFCs 50 are provided in the eight suction paths 44. The vacuum pumps 52 are disposed in merging parts 44b of the four suction paths 44 one by one. The optical sensor 54 is disposed above each slider 60.

The clamp 62 is operated, so that the connecting parts 2a of the eight battery units 2 are collectively connected to the connecting parts 46a of the eight adapters 46 at the same time (connection mechanism). The adapters 46, the solenoid valves 48, the MFCs 50, the vacuum pumps 52, and the optical sensors 54 are electrically connected to the control unit 56, and operation of the battery units 2 can be inspected at the same time.

Figure 10:
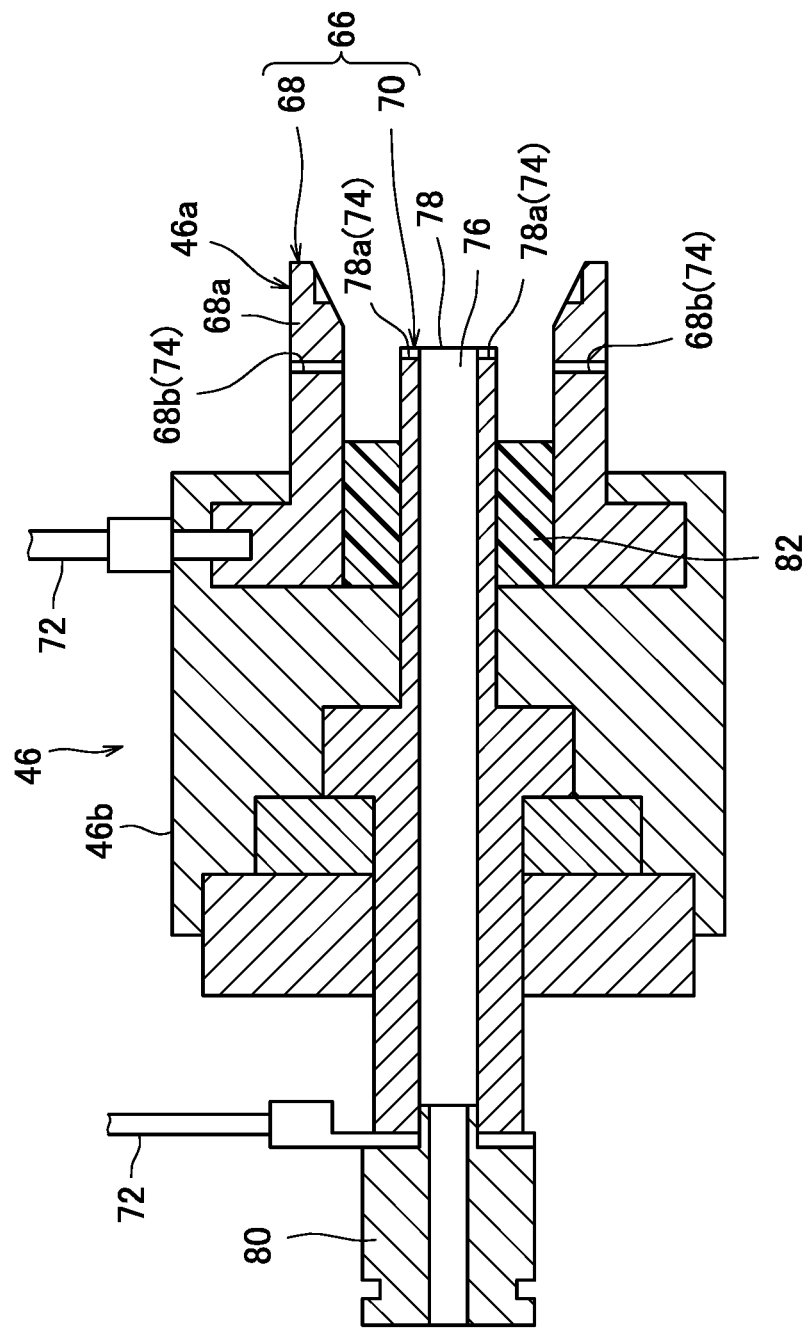
FIG. 10 is a sectional view of an adapter of FIG. 8.
Figure 11:
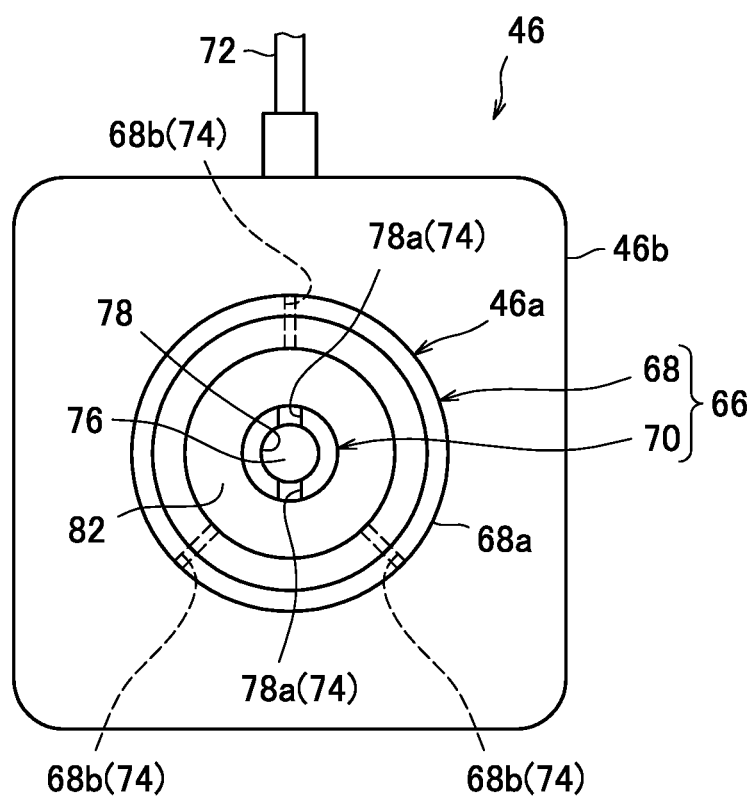
FIG. 11 is a front view of the adapter of FIG. 8.

As illustrated in FIG. 10 and FIG. 11, most portions of the connecting parts 46a of the adapters 46 are embedded in rectangular parallelepiped housings 46b. Each connecting part 46a includes an inspection terminal 66 having a similar shape to the electric terminal 38 of the atomizer unit 4. Each inspection terminal 66 includes an outer terminal (first terminal) 68 and an inner terminal (second terminal) 70 connected to an outer terminal 30 and an inner terminal 32 of the battery unit 2, respectively.

The outer and inner terminals 68, 70 are electrically connected to the control unit 56 through respective electric wires 72. Each outer terminal 68 is a cylindrical positive electrode, and is formed with three through holes (pressure adjustment mechanisms, communication parts) 68b in a cylindrical wall 68a thereof. These through holes 68b function as an air introducing port 74 to the suction path 44 at the time of inspection, similarly to the aforementioned cutouts 40c of the atomizer unit 4.

Each inner terminal 70 is a negative electrode disposed inside the outer terminal 68, and is formed in a tubular shape having a hollow 76, and a suction port 78 of the suction path 44 is opened in a first end of the inner terminal 70. That is, the suction path 44 is communicated with the pressure sensor 10 through the suction port 78. A connector 80 for connecting the tube 44a that reaches the solenoid valve 48 is mounted on a second end of the inner terminal 70. Respective cutouts (pressure adjustment mechanism, communication part) 78a are formed at facing positions in an opening end of the suction port 78. These cutouts 78a function as the air introducing port 74 of the suction path 44 at the time of inspection, similarly to the aforementioned cutout 42c of the atomizer unit 4.

Thus, the inspection device 100 of this embodiment includes the inspection terminals 66 electrically connected to the electric terminals 28 of the battery units 2, and the suction paths 44 connected to the pressure sensors 10 through the suction ports 78. Each adapter 46 has the connecting part 46a connected to the connecting part 2a of the battery unit 2 at the time of the inspection of the battery unit 2, and the suction port 78 forms a portion of the inspection terminal 66 in this connecting part 46a.

As described above, the outer terminal 30 and the inner terminal 32 of each battery unit 2 come into contact with the outer terminal 68 and the inner terminal 70 composing the inspection terminal 66, respectively when each battery unit 2 is connected to the adapter 46, and furthermore the inner terminal 70 composing the inspection terminal 66 is used also as the suction port 78 of the suction path 44.

Each adapter 46 has a seal part 82, with which the outer terminal 30 of the battery unit 2 comes into contact, between the outer terminal 68 and the inner terminal 70. The seal part 82 is formed in a cylindrical shape from resin having a relatively low hardness such as silicone rubber, and also services as electric insulating material between the outer terminal 68 and the inner terminal 70.

When the electric terminal 28 of each battery unit 2 is connected to the inspection terminal 66 of the adapter 46, the suction path 44 formed so as to reproduce the suction path 16 of the smoking article 1 can be formed by simple operation of just pressing the outer terminal 30 of the battery unit 2 against the seal part 82 without using screw connection like the atomizer unit 4.

Figure 8:
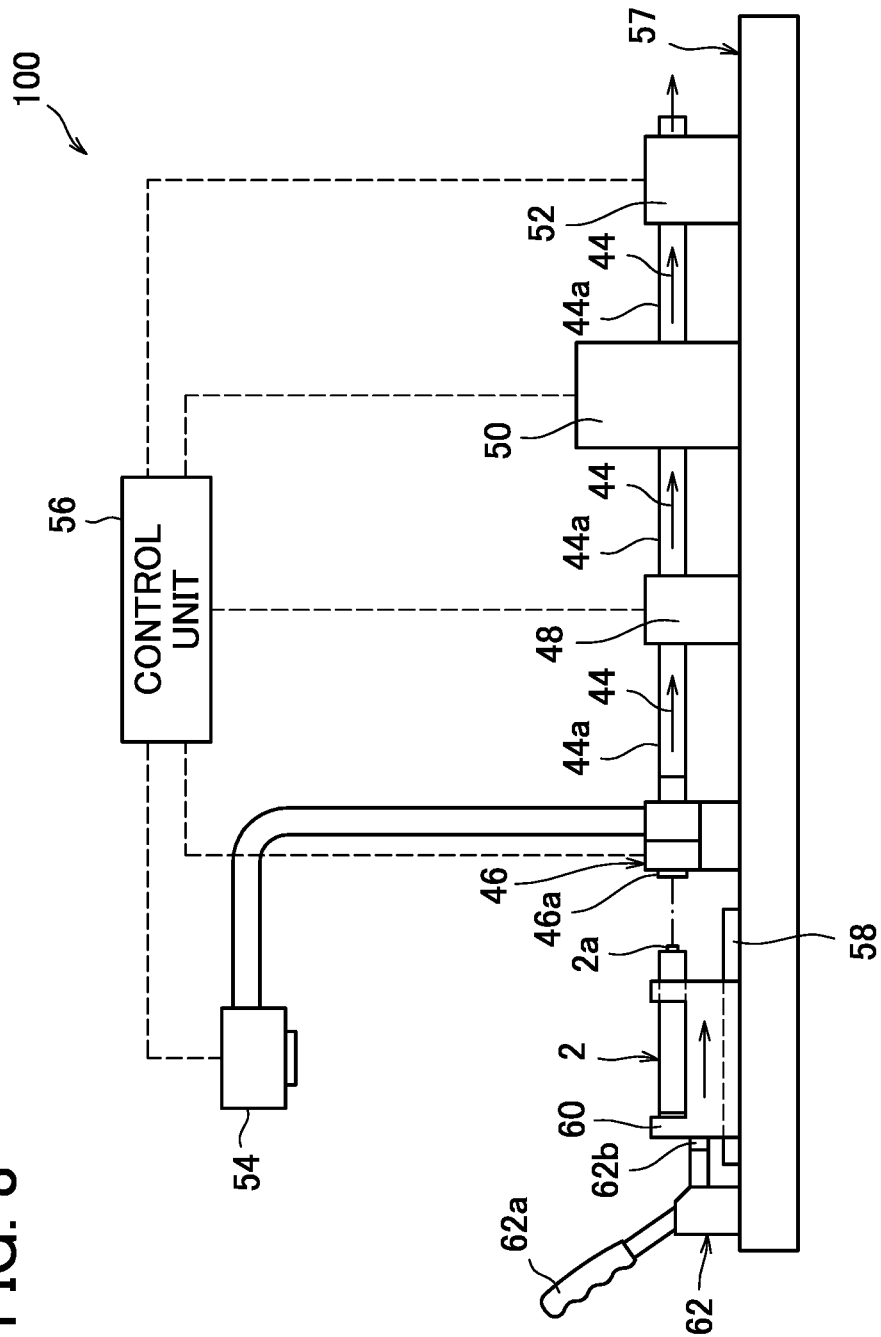
FIG. 8 is a diagram of an inspection device according to a first embodiment of the present invention, the inspection device being viewed from a lateral side.
Figure 12:
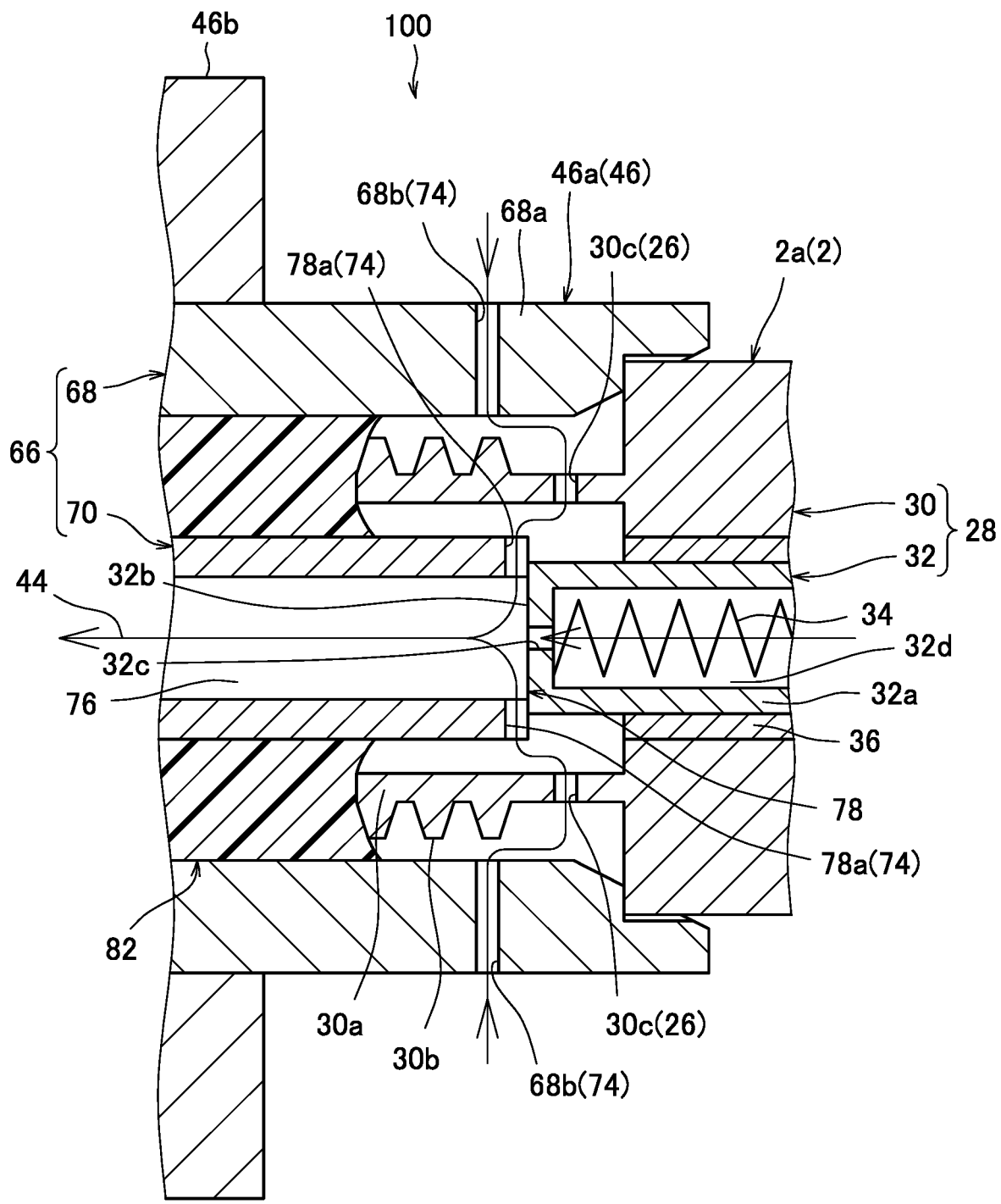
FIG. 12 is a sectional view of a state in which a connecting part of the adapter of FIG. 8 and a connecting part of a battery unit are connected to each other.

More specifically, as illustrated in FIG. 12, the suction path 44 at the time of inspection is formed by simple operation of just moving each battery unit 2 by movement of the slider 60 illustrated in FIG. 8, and pressing the outer terminal 30 against the seal part 82 of the adapter 46. At this time, the outer terminal 30 of the battery unit 2 comes into contact with the outer terminal 68 of the adapter 46, and the inner terminal 32 of the battery unit 2 is pressed against the inner terminal 70 of the adapter 46.

The inner terminal 32 of the battery unit 2 is pressed to the inside in the axial direction of the battery unit 2 against elastic force of the spring 34, and the bottom wall 32b of the inner terminal 32 of the battery unit 2, and the opening end of the suction port 78 of the inner terminal 70 of the adapter 46 comes into contact with each other. At this time, as illustrated in FIG. 12, an outer peripheral portion of the outer terminal 30 of the battery unit 2 comes into contact with a step of an inclined plane formed on an inner periphery of the outer terminal 68 of the adapter 46 over the whole periphery, and a certain degree of airtight space is formed inside the outer terminal 68.

When the vacuum pump 52 is started, and the solenoid valve 48 is opened in this state as illustrated in FIG. 8, the through hole 32c of the battery unit 2 and the suction port 78 of the adapter 46 are communicated with the clearance 2c as illustrated by arrows in FIG. 12. Consequently, the suction path 44 from the clearance 2c of the battery unit 2 to the vacuum pump 52 at the time of inspection is formed.

At the time of suction in the inspection device 100, as illustrated by the arrows in FIG. 12, air outside the inspection device 100 sequentially passes through the three through holes 68b of each adapter 46, the four through holes 30c of each battery unit, and the two cutouts 78a of each adapter 46, all of which function as the air introducing port 74, and thereafter the air is introduced from the suction port 78 of the adapter 46 to the suction path 44.

Therefore, at the time of suction in the inspection device 100, similarly to the time of suction of the actual smoking article 1, adequate negative pressure is generated in the clearance 2c of each battery unit 2, and the pressure sensor 10 detects this negative pressure, and the LED 14 lights. The LED 14 lights, so that a condition under actual use of the actual smoking article 1 can be created in a simulation manner. The frequency of detection of negative pressure detected by each pressure sensor 10 is counted as a puff frequency of the actual smoking article 1, and is recorded in the control unit 56.

Hereinafter, the inspection sequence of the battery unit 2 performed by the control unit 56 will be described with reference to a flowchart of FIG. 13. Inspection items of each battery unit 2 are roughly classified into electric inspection related to the battery 8, and negative pressure inspection related to the pressure sensor 10 which operates at the time of suction.

In order to perform the inspection sequence, a short circuit, a charging circuit, a resistance measurement circuit, a load circuit (not illustrated), and the like for creating simulative conditions corresponding to the inspection items are previously stored in the control unit 56. The control unit 56 includes a display operation part 84 such as a touch panel enabling various setting by a worker who display an inspection result, warning and the like, and perform inspection.

The inspection sequence is started in a state in which the battery units 2 are connected to the adapters 46, and first inspects a leakage current of each battery unit 2 in Step S1. Specifically, short circuit conditions of the battery units 2 are created by switching into the short circuit in the control unit 56, offset is previously measured, and thereafter the leakage current of each battery unit 2 are measured. In a case in which the leakage current is generated in each battery unit 2, warning is displayed on the display operation part 84, and the process is shifted to the next Step S2.

In Step S2, charging capability of each battery unit 2 is inspected. Specifically, a condition in which the battery units 2 are being charged is creased by switching into the charging circuit in the control unit 56, and the charging capability of each battery unit 2 is inspected. At this time, operation of the LEDs 14 linked with the batteries 8 during charging is also inspected through the optical sensors 54.

Furthermore, in Step S2, the charging voltages of the battery units 2 are measured. In a case in which there is any failure in a light emission mode of each LED 14 linked with the battery 8, warning is displayed on the display operation part 84, and the process is shifted to the next Step S3.

In Step S3, behavior at the time of the short circuit of each battery unit 2 is inspected. Specifically, short circuit conditions of the battery units 2 are created by switching into the short circuit in the control unit 56, and it is inspected whether or not each battery unit 2 is shifted to a safety mode at the time of a short circuit. Additionally, the light emission modes of the LEDs 14 linked with the batteries 8 at the time of short circuits are also inspected through the optical sensors 54. In a case in which there is failure in the behavior at the time of the short circuit of each battery unit 2, and the light emission mode of each LED 14, warning is displayed on the display operation part 84, the process is shifted to the next Step S4.

In Step S4, a load of each battery unit 2 is inspected. Specifically, resistance of each battery unit 2 is measured by switching into the resistance measurement circuit in the control unit 56. In a case in which there is failure in the resistance of each battery unit 2, warning is displayed on the display operation part 84, and the process is shifted to the next Step S5.

In Step S5, the leakage current of each battery unit 2 is inspected. Specifically, short circuit conditions of the battery units 2 are created by switching into the short circuit in the control unit 56, offset is previously measured, and thereafter the leakage current of each battery unit 2 is measured. In a case in which the leakage current is generated in each battery unit 2, warning is displayed on the display operation part 84, and the process is shifted to the next Step S6.

in Step S6, operation of a reset mode of each battery unit 2 is inspected. Specifically, a condition in which a load is applied to each battery unit 2 is created by switching into the load circuit in the control unit 56, the battery units 2 are shifted to the reset modes, the solenoid valves 48 are suitably opened in a state in which the vacuum pumps 52 are started. Then, pressure in the clearance 2c of each battery unit 2 is made negative, the negative pressure is detected by the pressure sensor 10, and the light emission mode of each LED 14 at this time is confirmed through the optical sensor 54, so that whether or not the reset mode is suitably operated is inspected.

Furthermore, an output voltage and output time during loading of each battery unit 2, and operation of the LED 14 linked with the battery 8 is inspected through the optical sensor 54. In a case in which there is failure in the output voltage and the output time during loading of each battery unit 2, or the light emission mode in each LED 14, warning is displayed on the display operation part 84.

In the reset mode, the frequencies of negative pressure detection by the pressure sensors 10, counted and recorded by the control unit 56 at the time of inspection are reset, and the battery units 2 can be each reset in a shippable state. In a case in which there is failure in the reset mode operation of each battery unit 2, warning is displayed on the display operation part 84, and the inspection of the battery units 2 is ended.

Abnormal information of the battery units 2 obtained in the inspection of Steps S1 to S6 is stored in the control unit 56, and is available to product improvement of the battery units 2. The stored abnormal information may be collectively output per acquired day, per production lot of the battery unit 2, per predetermined timing. The process of starting the vacuum pumps 52, detecting negative pressure by the pressure sensors 10, inspecting the light emission modes of the LEDs 14 by the optical sensors 54 is not limited to Steps S2, S3, S6, but can be performed in other steps in accordance with the specification of the battery units 2, as illustrated in FIG. 13.

As described above, the inspection device 100 for the battery units 2 of this embodiment can independently inspect the battery units 2 of the smoking articles 1. Consequently, whether or not failure in each smoking article 1 exists in the battery unit 2 can be easily determined compared to a case in which the smoking articles 1 that are integrated with battery units 2 and the atomizer units 4 and assembled are inspected. Accordingly, the failure of each battery unit 2 can be more accurately specified in a short time, and therefore it is possible to improve the inspection efficiency and the inspection precision of the battery units 2.

The suction ports 78 formed in the suction paths 44 in the inspection device 100 form respective one portions of the inspection terminals 66. Therefore, electric inspection related to the battery units 2, and negative pressure inspection related to the pressure sensors 10 which operate at the time of suction can be performed in one inspection region at the same time. Accordingly, it is possible to further improve the inspection efficiency of the battery units 2.

The inspection device 100 includes the adapters 46 to be connected to the battery units 2 when the battery units 2 are inspected, and the inspection terminals 66 and the suction ports 78 are formed in the adapters 46. Therefore, the electric inspection and the negative pressure inspection of the battery units 2 can be performed at the same time by simple operation of just pressing the connecting parts 2a of the battery units 2 against the connecting parts 46a of the adapters 46. Accordingly, it is possible to further improve the inspection efficiency of the battery units 2.

Specifically, each inspection terminal 66 is composed of the outer terminal 68 that comes into contact with the outer terminal 30 as the one electrode of the electric terminal 28, when the battery unit 2 is connected to the adapter 46, and the inner terminal 70 that comes into contact with the inner terminal 32 as the other electrode of the electric terminal 28, when the battery unit 2 is connected to the adapter 46, and that forms the suction port 78. Consequently, in each battery unit 2 having the through hole 32c forming one portion of the suction path 16 in the inner terminal 32 like this embodiment, the battery unit 2 can be independently inspected in a state in which the actual smoking article 1 is reproduced. Accordingly, it is possible to further improve the inspection efficiency and the inspection precision of each battery unit 2.

Each adapter 46 has the seal part 82, with which the outer terminal 30 of the battery unit 2 comes into contact, between the outer terminal 68 and the inner terminal 70. Consequently, when the electric terminal 28 of the battery unit 2 is connected to the inspection terminal 66 of the adapter 46, the suction path 44 formed so as to reproduce the suction path 16 of the smoking article 1 can be formed by simple operation of just pressing the outer terminal 30 of the battery unit 2 against the seal part 82. Accordingly, it is possible to further improve the inspection efficiency and the inspection precision of each battery unit 2.

The inspection device 100 includes the eight adapters 46, the eight suction paths 44 corresponding to the respective adapters 46, and the two vacuum pumps 52 each provided in the merging parts 44b of the four suction paths 44. Consequently, the control unit 56 can inspect operation of the eight battery units 2 at the same time. Accordingly, it is possible to further improve the inspection efficiency of the battery units 2.

Specifically, the inspection device 100 includes the two sliders 60 each detachably holding the battery units 2 with postures directing the respective electric terminals 28 of the four battery unit 2 in the same direction, and the fixing base 57 that fixes the adapters 46 with postures in which the inspection terminals 66 and the suction ports 78 of the eight adapters 46 face the electric terminals 28 of the eight battery units 2.

The sliders 60 are slid in the axial direction of the battery units 2 by operation of the clamp 62, and the clearances 2c that reach the pressure sensors 10 of the battery unit 2, and the suction paths 44 of the inspection device 100 can be collectively communicated with each other. In addition, the electric terminals 28 of the battery units 2, and the inspection terminals 66 of the inspection device 100 can be collectively connected to each other. Accordingly, a plurality of the battery units 2 can be connected to the inspection device 100 to be inspected at the same time by one action, and therefore it is possible to further improve the inspection efficiency of the battery units 2.

The MFCs 50 are provided between the suction ports 78 of the suction paths 44 and the vacuum pumps 52, so that the suction flow rates of the suction paths 44 can be adjusted in accordance with the inspection item. Accordingly, inspection in various puffing forms in accordance with the inspection item can be performed, and therefore it is possible to further improve the inspection precision of the battery units 2.

In the outer terminals 68 and the inner terminals 70 composing the inspection terminals 66 of the inspection device 100, the through holes 68b and the cutouts 78a are provided as the air introducing ports 74 of the suction paths 44. Consequently, it is possible to suppress generation of excessive negative pressure in the clearances 2c of the battery units 2 at the time of start of the vacuum pumps 52, and to adjust the negative pressure in the clearance 2c to a condition in which actual suction of the smoking articles 1 is reproduced. Accordingly, it is possible to further improve the inspection precision of the battery units 2 while suppressing breakage of the pressure sensors 10 by excessive negative pressure.

The control unit 56 inspects the leakage current of each battery unit 2, charging capability, behavior at the time of a short circuit, resistance, output voltage, and output time, the detection mode of negative pressure by each pressure sensor 10, the light emission mode of each LED 14, and operation of the reset mode, in the inspection sequence. Thus, the various inspection items are inspected, so that the electric inspection related to the battery units 2, and the negative pressure inspection related to the pressure sensors 10 that operate at the time of suction can be effectively performed by single inspection, and therefore it is possible to further improve the inspection efficiency and the inspection precision of the battery units 2.

The light emission modes of the LEDs 14 detected by the optical sensors 54 are inspected in the inspection sequence, so that it is possible to accurately and efficiently perform the electric inspection related to the battery units 2, and the negative pressure inspection related to the pressure sensors 10. Consequently, it is possible to further improve the inspection efficiency and the inspection precision of the battery units 2.

The operation in the reset mode is inspected in the inspection sequence, so that it is possible to reset the frequency of negative pressure detection by the pressure sensor 10, recorded at the time of inspection, and to shift the state into a shipping state. Consequently, it is possible to further improve the inspection efficiency of the battery units 2.

The description of the first embodiment of the present invention is now completed. However, the present invention is not limited to these, and various changes can be performed without departing from the spirit of the present invention.

Figure 14:
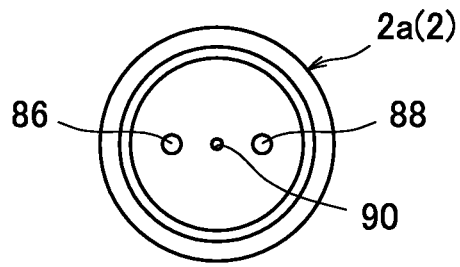
FIG. 14 is a front view of a connecting part of a battery unit of a smoking article, different from that of the aforementioned embodiment.

For example, as a modification of the first embodiment, the present invention is applicable to a case in which respective protruding electric terminals 86, 88 of positive and negative electrodes are separately disposed in a connecting part 2a of a battery unit 2, as illustrated in FIG. 14. A through hole 90 for forming a suction path 44 is opened between the electric terminals 86, 88 of the connecting part 2a.

Figure 15:
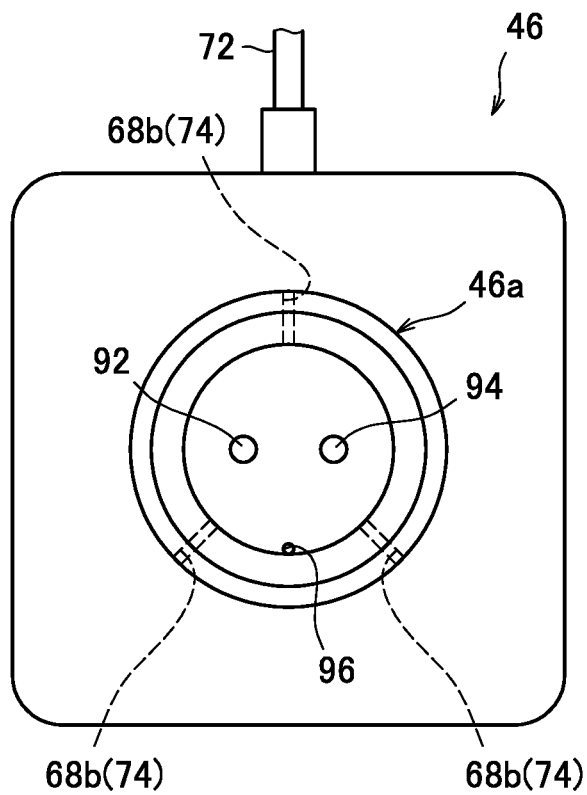
FIG. 15 is a front view of an adapter of an inspection device according to a modification of the first embodiment.
Figure 16:
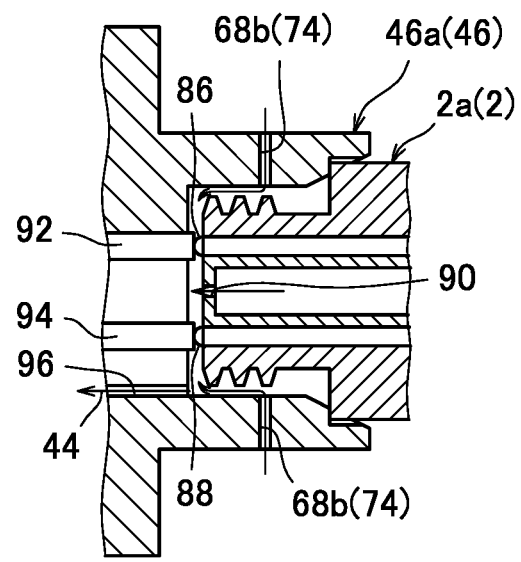
FIG. 16 is a sectional view of a state in which the connecting part of the battery unit of FIG. 14 is connected to the adapter of FIG. 15.

In this case, as illustrated in FIG. 15 and FIG. 16, protruding inspection terminals 92, 94 corresponding to the electric terminals 86, 88 are separately provided in a connecting part 46a of an adapter 46. A suction port 96 is separately provided in an appropriate place of the connecting part 46a, so that a suction path 44 can be formed. Also in this case, it is possible to independently perform electric inspection and negative pressure inspection of the battery unit 2, and therefore it is possible to improve of the inspection efficiency battery unit 2.

In the first embodiment, in a case in which the electric inspection and the negative pressure inspection of the battery units 2 can be performed by connection of the battery units 2, the inspection device 100 does not always include the adapters 46, each of which includes an inspection terminal 66 and a suction port 78, and electric inspection and negative pressure inspection may be inspected in different inspection regions.

In the first embodiment, when negative pressure of the clearance 2c of each battery unit 2 at the time of suction can be detected, a suction detection part different from the pressure sensor 10 may be provided at an appropriate place of the suction path 44.

In the first embodiment, flow rate control means different from the MFC 50 may be provided at an appropriate place of each suction path 44.

In the first embodiment, pressure adjustment means different from the through holes 68b and the cutouts 78a formed as the air introducing port 74 in the inspection terminal 66 may be provided at appropriate places so as to be communicated with each suction path 44. Additionally, pressure adjustment means may be provided on the air pipe tube 44a composing each suction path 44. In this case, each pressure adjustment means may be preferably provided between the suction port 78 (or 96) of the suction path 44 and the MFC 50.

In the first embodiment, the numbers of the adapters 46, the suction paths 44, the solenoid valves 48, and the MFCs 50, and the vacuum pumps 52, the optical sensors 54, and the like composing the inspection device 100 are not limited to those in the aforementioned embodiment, and can be suitably changed in accordance with required specifications.

In the first embodiment, collective connection means of the inspection device 100 and the battery units 2 is not limited to the connection mechanism illustrated in FIG. 9, and may be automatic connection of automatically and electrically moving the sliders 60 in place of the clamp 62 manually operated. Alternatively, the battery units 2 may be automatically inspected by the inspection device 100 during production of the battery units 2.

Figure 13:
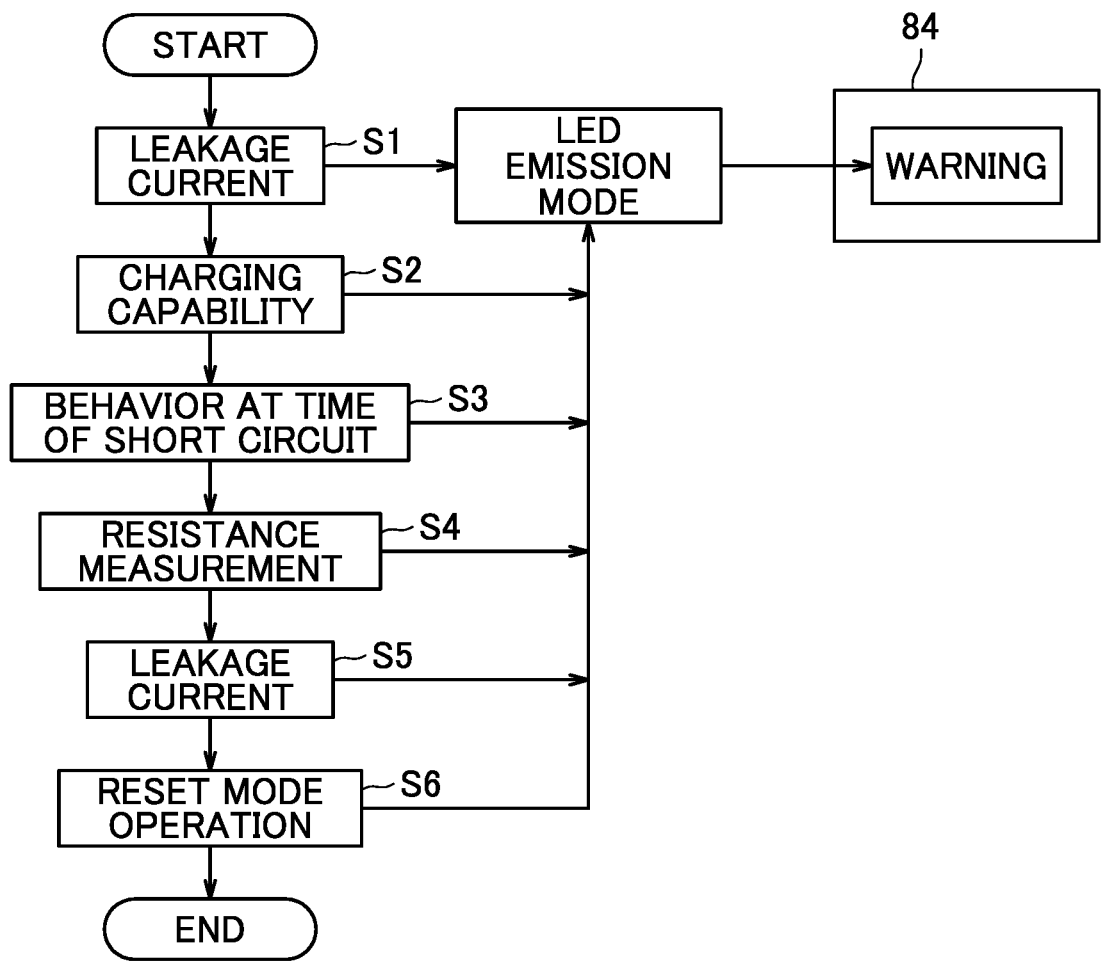
FIG. 13 is a flowchart of an inspection sequence performed by a control unit of FIG. 8.

As long as the electric inspection related to the batteries 8, and the negative pressure inspection related to the pressure sensors 10 which operate at the time of suction are performed in the inspection sequence of the first embodiment, the inspection items are not limited to the inspection items described by using FIG. 13. For example, at least any one of the leakage current of each battery unit 2, and charging capability, behavior at the time of a short circuit, resistance, output voltage, and output time, and at least a negative pressure detection mode by each pressure sensor 10 may be inspected. Additionally, the negative pressure detection mode by each pressure sensor 10 may include detection of ventilation resistance.

Second Embodiment

Hereinafter, an inspection device 200 according to a second embodiment for battery units 2 will be described with reference to FIG. 17 to FIG. 21. In the following description, characteristics different from those of the first embodiment will be mainly described, and description of characteristics similar to those of the first embodiment will be omitted while the same reference numerals are added to the specification or drawings, or the description itself will be omitted.

The inspection device 200 includes a connection mechanism, suction paths 44, adapters 46, solenoid valves 48, MFCs 50, vacuum pumps 52, optical sensors 54, and a control unit 56 illustrated in FIG. 9 in a similar placement manner to the inspection device 100 of the first embodiment illustrated in FIG. 8 and FIG. 9. However, when the battery units 2 are inspected, connecting parts 46a of the adapters 46 of the inspection device 200 are merely communicated with pressure sensors 10 through spaces 32d of the battery units 2, but are not electrically connected to batteries 8. That is, the inspection device 200 performs only negative pressure inspection related to the pressure sensors 10 that operate at the time of suction, and does not perform electric inspection related to the battery units.

Figure 17:
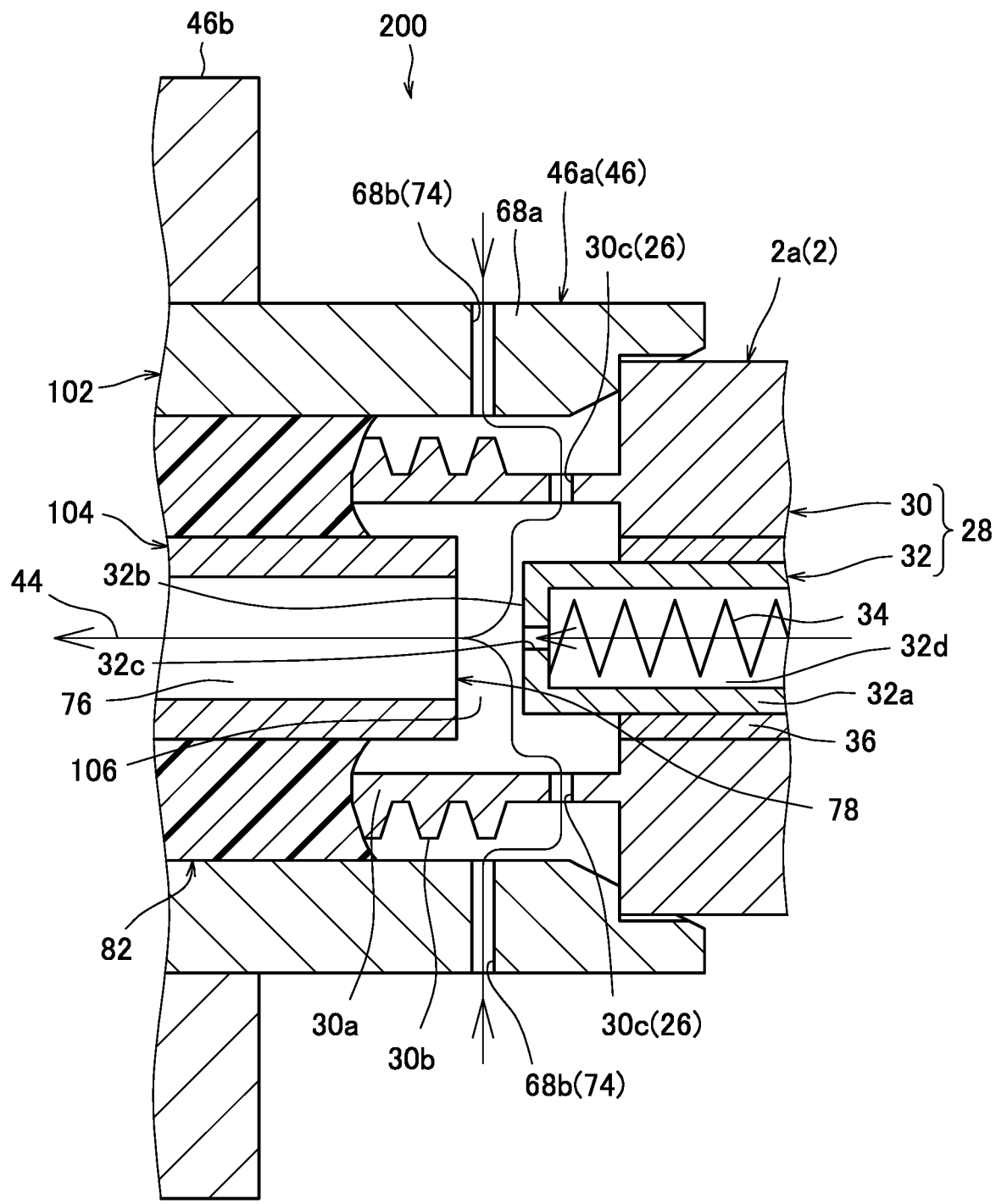
FIG. 17 is a sectional view of an adapter of an inspection device according to a second embodiment of the present invention.

As illustrated in FIG. 17, an outer cylinder 102 formed with three through holes 68b, and an inner cylinder 104 having an opened suction port 78 of the suction path 44 at an end are formed in each of the connecting parts 46a of the adapters 46. The outer cylinder 102 and the inner cylinder 104 are not electrodes, and therefore are not limited to metal, but may be made of resin. The inner cylinder 104 retains and separates an inner terminal 32 and a space 106, and the space 106 forms one portion of the suction path 44. When the battery unit 2 is connected to the adapter 46, the outer cylinder 102 comes into contact with a cylindrical wall 68a of an outer terminal 30, and a cylindrical wall 30a of the outer terminal 30 comes into contact with a seal part 82 formed between the outer cylinder 102 and the inner cylinder 104.

Figure 18:
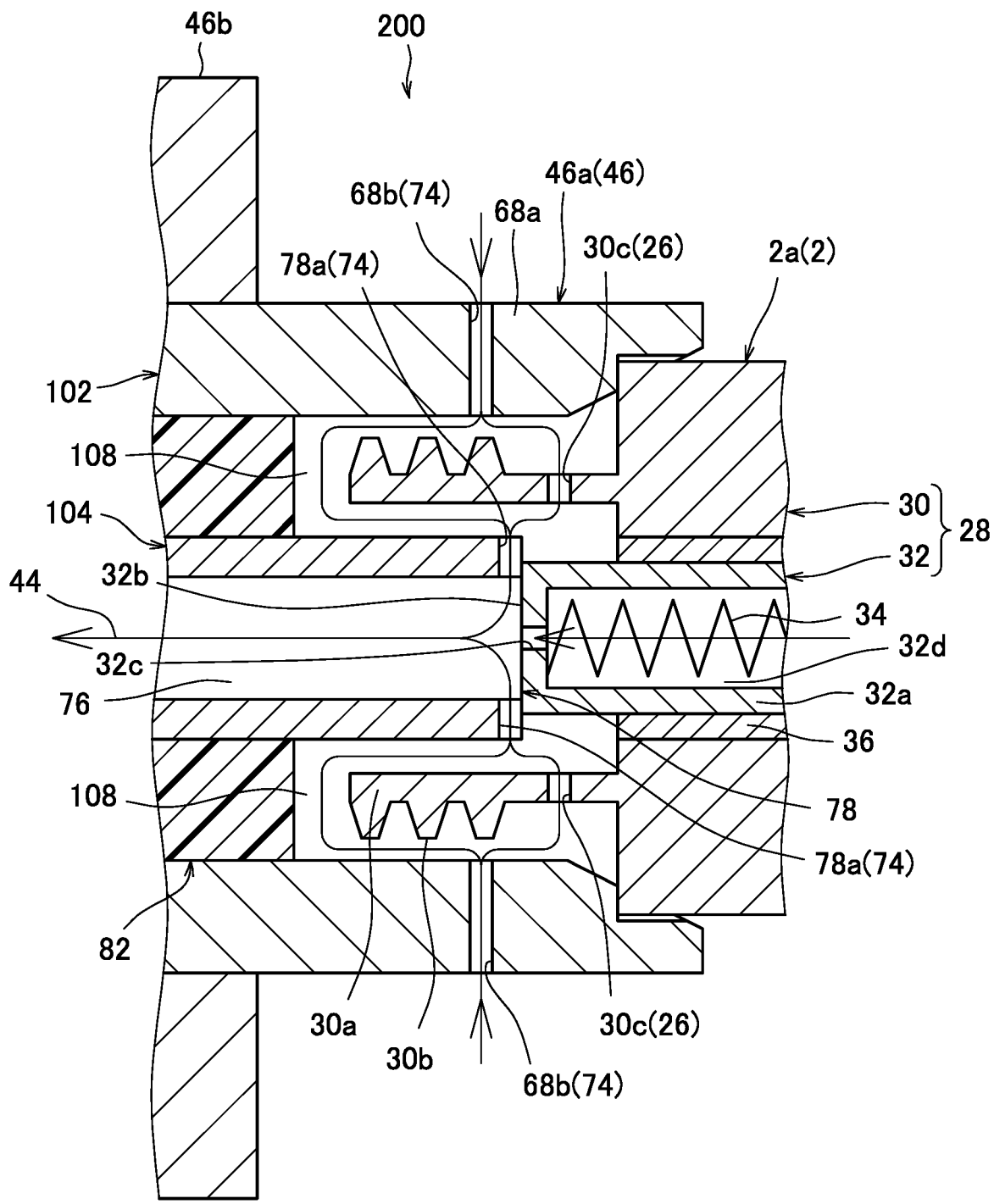
FIG. 18 is a sectional view of an adapter of an inspection device according to a modification of the second embodiment.

As illustrated in FIG. 18, when the battery unit 2 is connected to the adapter 46, the outer cylinder 102 may come into contact with the cylindrical wall 68a of the outer terminal 30, and the inner cylinder 104 may come into contact with the inner terminal 32. In this case, the seal part 82 retains and separates the cylindrical wall 30a of the outer terminal 30 and a space 108, and the space 108 forms one portion of the suction path 44.

Figure 19:
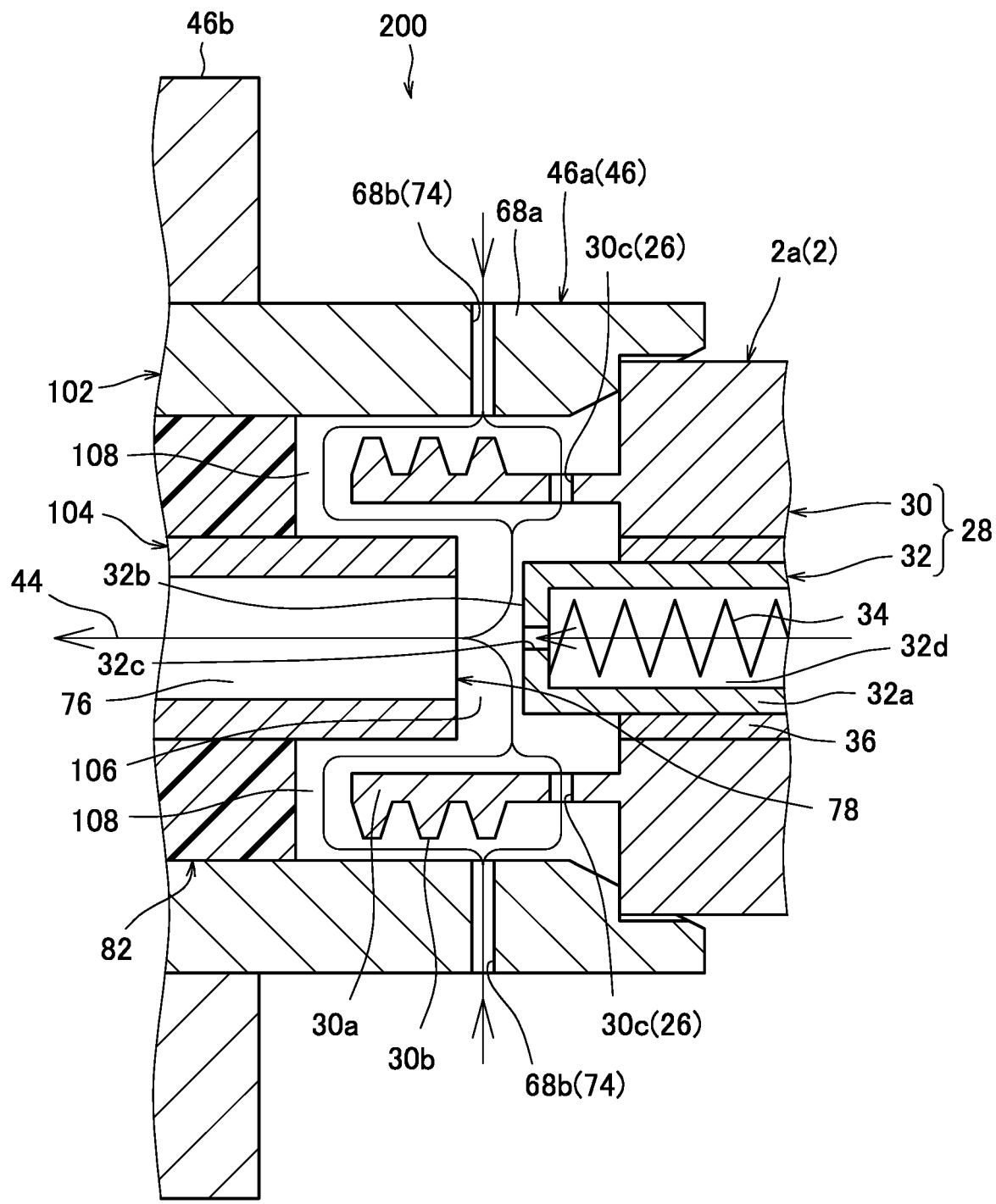
FIG. 19 is a sectional view of an adapter of an inspection device according to another modification of the second embodiment.

As illustrated in FIG. 19, when the battery unit 2 is connected to the adapter 46, the outer cylinder 102 may merely come into contact with the cylindrical wall 68a of the outer terminal 30. In this case, the spaces 106, 108 are formed, and these spaces 106, 108 form one portion of the suction path 44.

Figure 20:
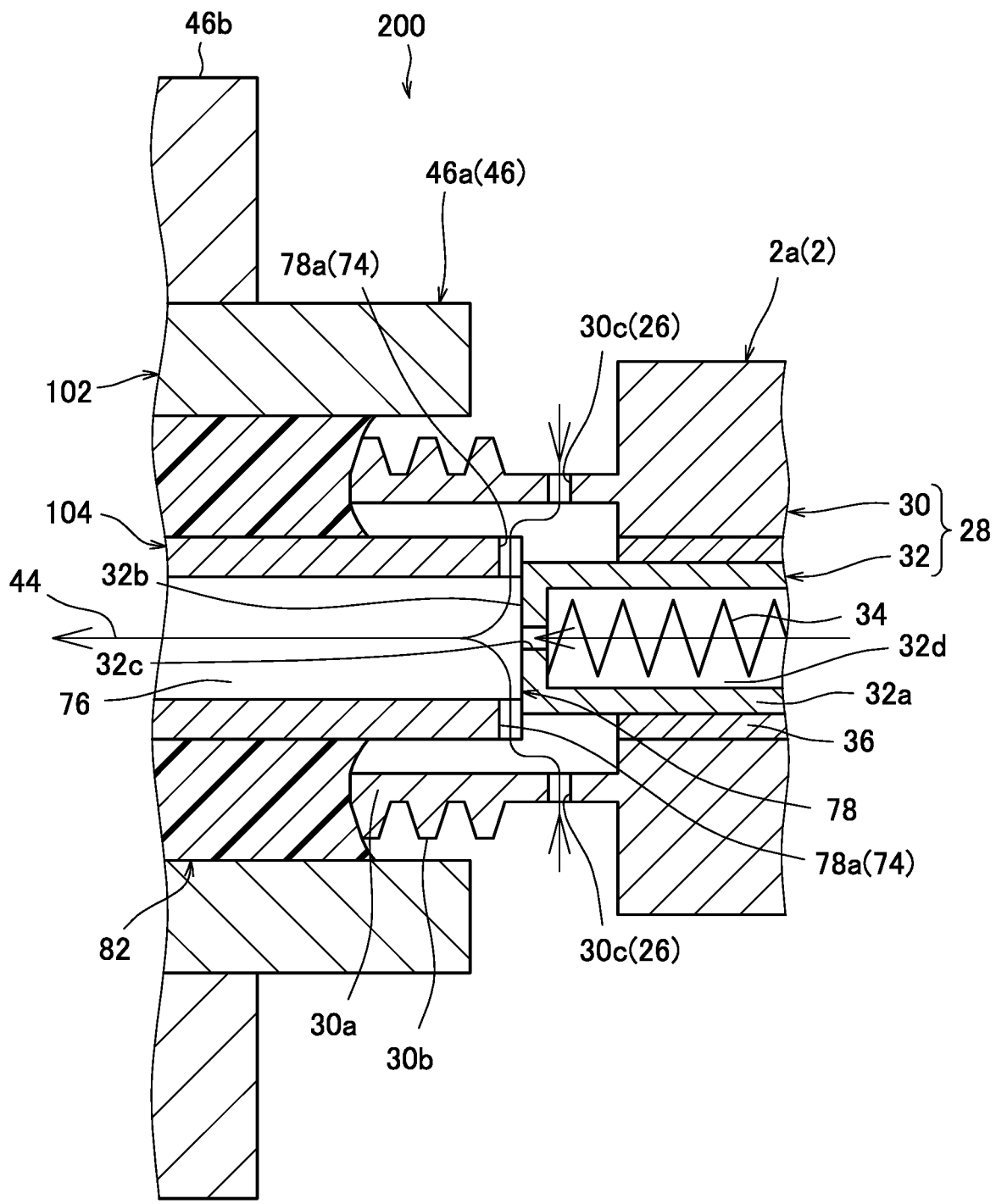
FIG. 20 is a sectional view of an adapter of an inspection device according to yet another modification of the second embodiment.

As illustrated in FIG. 20, while the seal part 82 may come into contact with the cylindrical wall 30a of the outer terminal 30, the outer cylinder 102 may not come into contact with the cylindrical wall 68a of the outer terminal 30. In this case, although through holes 68b are not formed in the outer cylinder 102, through holes 30c formed in the cylindrical wall 30a of the outer terminal 30 function as an air introducing port 74 of the suction path 44.

Figure 21:
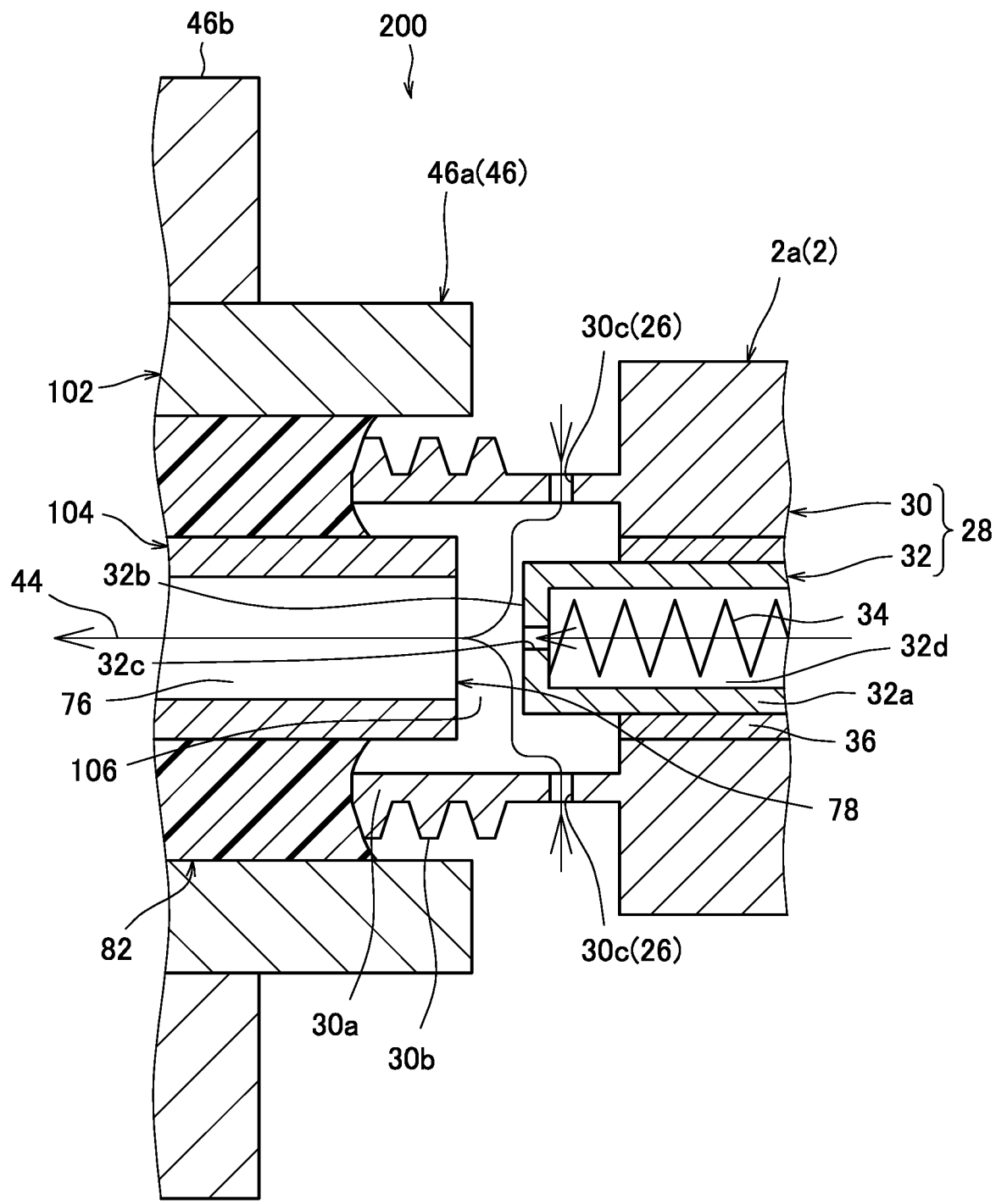
FIG. 21 is a sectional view of an adapter of an inspection device according to yet another modification of the second embodiment.

As illustrated in FIG. 21, in a case of FIG. 20, a space 106 illustrated in FIG. 17 is further formed, and this space 106 may be one portion of a suction path 44.

In any of the inspection devices 200 of FIG. 17 to FIG. 21, when the battery units 2 are connected to the adapters 46, the suction paths 44 formed so as to reproduce suction paths 16 of smoking articles 1 can be formed by simple operation of just pressing the connecting parts 2a of the battery units 2 against the connecting parts 46a of the adapters 46.

In an inspection sequence of the battery units 2 performed by the control unit 56 of the inspection device 200, only an item of the negative pressure inspection related to the pressure sensors 10 that operate at the time of suction is inspected. For example, as the negative pressure detection mode by the pressure sensors 10, whether or not the ventilation resistance of each suction path 44 is proper is inspected, and a light emission mode of each LED 14 linked with the battery 8 is further inspected similarly to the case of the first embodiment.

As described above, the inspection device 200 of this embodiment can perform the electric inspection of the battery units 2 elsewhere, and perform independently the negative pressure inspection of the battery units 2 that pass the electric inspection. Consequently, similarly to the inspection device 100 of the first embodiment, whether or not failure in each smoking article 1 exists in the battery unit 2 can be easily determined compared to a case in which inspection is performed in a state of each smoking article 1 already assembled.

Accordingly, the failure related to suction operation of each battery unit 2 can be more accurately specified in a short time, and therefore it is possible to improve the inspection efficiency and the inspection precision of the battery units 2. Additionally, it goes without saying that the inspection device 200 produces similar effects according to other configurations similar to those of the inspection device 100 of the first embodiment.

Third Embodiment

Hereinafter, an inspection device (second inspection device) 300 according to a third embodiment for battery units 2 will be described with reference to FIG. 22 and FIG. 23. In the following description, characteristics different from those of the first embodiment will be mainly described, and description of characteristics similar to those of the first embodiment will be omitted while the same reference numerals are added to the specification or drawings, or the description itself will be omitted.

When the battery units 2 are inspected, connecting parts 46a of adapters 46 of the inspection device 300 are merely electrically connected to batteries 8, but are not communicated with pressure sensors 10 through spaces 32d of the battery units 2. That is, the inspection device 300 performs only electric inspection related to the battery units 2, and does not perform negative pressure inspection related to the pressure sensors 10 that operate at the time of suction of the battery units 2.

Figure 22:
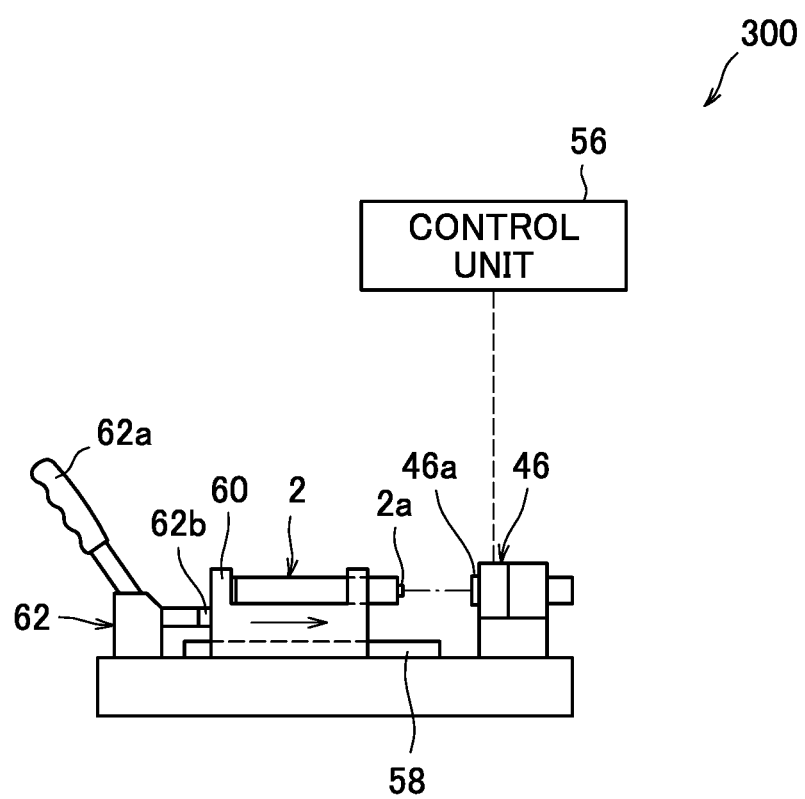
FIG. 22 is a diagram of an inspection device according to a third embodiment of the present invention, the inspection device being viewed from a lateral side.

As illustrated in FIG. 22, the inspection device 300 has a connection mechanism, adapters 46, and a control unit (second control unit) 56 illustrated in FIG. 9, but does not includes any suction paths 44, any solenoid valves 48, any MFCs 50, any vacuum pumps 52, and any optical sensors 54.

Figure 23:
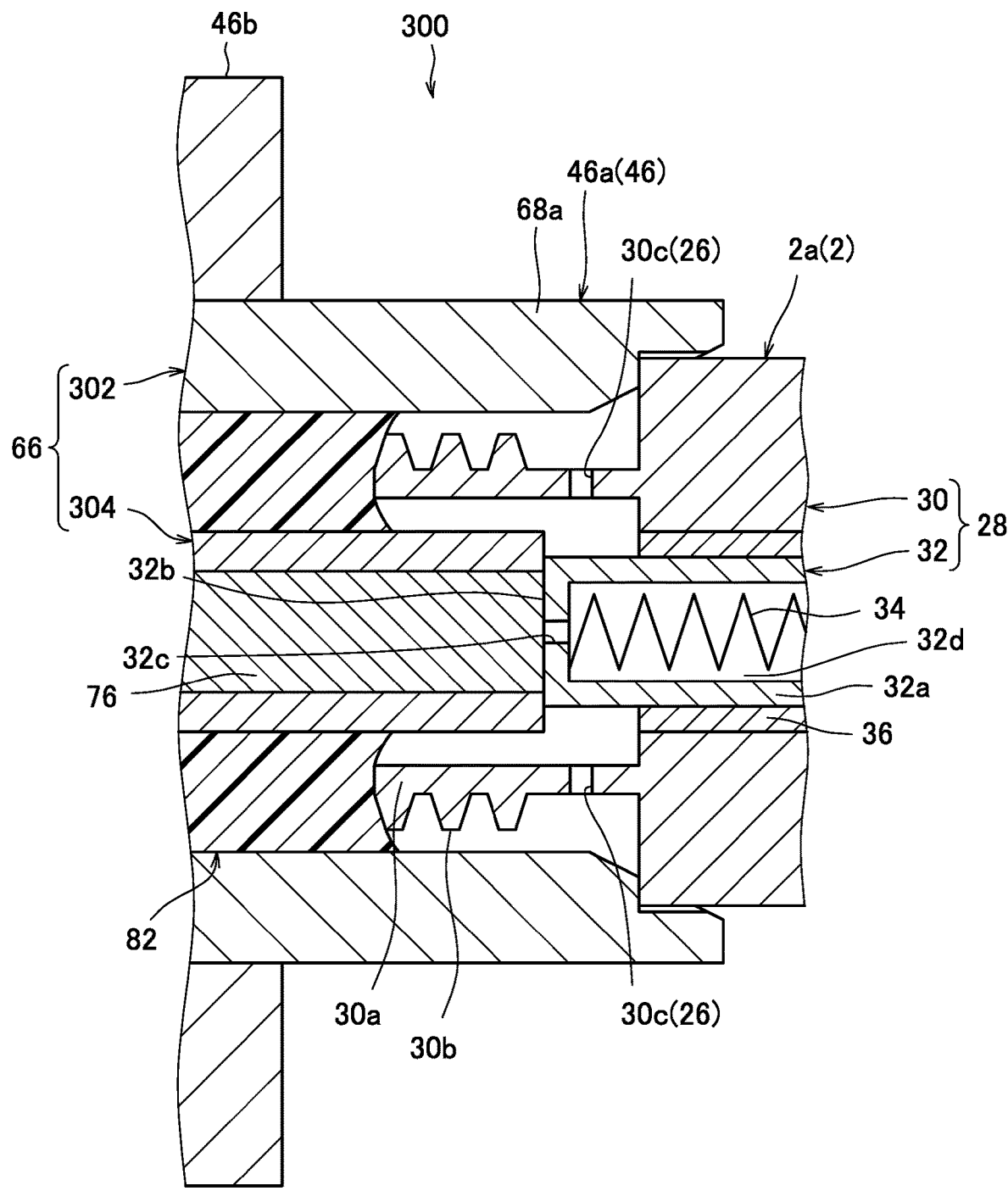
FIG. 23 is a sectional view of an adapter of FIG. 22.

As illustrated in FIG. 23, each connecting part 46a of the adapter 46 includes an inspection terminal 66, but does not include a suction port 78.

Each inspection terminal 66 is composed of an outer terminal 302 and an inner terminal 304 connected to an outer terminal 30 and an inner terminal 32 of the battery unit 2, respectively. The inspection device 300 does not perform the negative pressure inspection, and therefore any through holes 68b are not formed in the outer terminal 302, and the inner terminal 304 is not cylindrical but solid. As long as the outer terminal 302 and the inner terminal 304 of the adapter 46 are connected to the outer terminal 30 and the inner terminal 32 of the battery unit 2, respectively, the adapter 46 may have a simple shape illustrated in FIG. 15 and FIG. 16.

The inspection device 300 can efficiently perform electric inspection of the battery units 2 by simple operation of just pressing the connecting parts 2a of the battery units 2 against the connecting parts 46a of the adapters 46 when the battery units 2 are connected to the adapter 46. In an inspection sequence of the battery units 2 performed by the control unit 56 of the inspection device 300, only an item of the electric inspection related to the batteries 8 is inspected. That is, at least any one of the leakage current of each battery unit 2, and charging capability, behavior at the time of a short circuit, resistance, output voltage, and output time may be inspected.

As described above, the inspection device 300 of this embodiment can perform the negative pressure inspection of the battery units 2 elsewhere, and independently perform the electric inspection of the battery units 2 that pass the negative pressure inspection. Consequently, similarly to the inspection device 100 of the first embodiment, whether or not failure in each smoking article 1 exists in the battery unit 2 can be easily determined compared to a case in which inspection is performed in a state of each smoking article 1 already assembled.

Accordingly, the failure related to electric driving of each battery unit 2 can be more accurately specified in a short time, and therefore it is possible to improve the inspection efficiency and the inspection precision of the battery units 2. Additionally, it goes without saying that the inspection device 300 produces similar effects according to other configurations similar to those of the inspection device 100 of the first embodiment.

Fourth Embodiment

Hereinafter, an inspection system 400 for battery units 2 will be described with reference to FIG. 24 and FIG. 25. The inspection system 400 illustrated in FIG. 24 includes a carrying-in station 402, a conveyor 404, a first picking station 406, an inspection station 408, and a second picking station 410. For example, a tray 412 on which the four battery units 2 are disposed is carried in the carrying-in station 402 from an assembling station (not illustrated) for the battery units 2.

The conveyor 404 is, for example, a chain conveyor obtained by winding an endless chain 404a around a pair of sprockets 404c rotated by rotating shafts 404b. A large number of holders 414 for storing the battery units 2 are mounted on the chain 404a at intervals. The conveyor 404 sequentially and intermittently carries the holders 414 to the stations 402, 406, 408, 410 along an annular carrier path 416 in the arrow direction.

A picking device (not illustrated) is provided in the first picking station 406, and this picking device picks the battery units 2 disposed on the tray 412 to store the picked battery unit 2 in each holder 414 sequentially carried.

In the inspection station 408, the inspection device 300 described in the third embodiment, and the inspection device 200 described in the second embodiment are disposed along the carrier path 416 in such a direction as to carrying the holders 414.

The holders 414 being carried by the conveyor 404 are first moved to such a position as to face the inspection device 300. Then, connecting parts 46a of four adapters 46 of the inspection device 300 are pressed against connecting parts 2a of the battery units 2 stored in each holder 414, and are connected to the connecting parts 2a, so that electric inspection of the battery units 2 are collectively performed.

When the electric inspection of the battery units 2 are ended, the holder 414 is moved to such a position as to face the inspection device 200. Then, connecting parts 46a of four adapters 46 of the inspection device 200 are pressed against the connecting parts 2a of the battery units 2 stored in each holder 414, and are connected to the connecting parts 2a, so that negative pressure inspection of the battery units 2 are collectively performed. Contact and separation of the inspection device 300, 200 to the respective holders 414 illustrated by the arrow directions in FIG. 24 are automatically performed at carrying timing of the holders 414, and this automatic contact and separation can be implemented by automation of operation of the clamp 62 of the connection mechanism illustrated in FIG. 9.

In the second picking station 410, a picking device (not illustrated) is provided. This picking device picks and carries out the battery units 2 from each holder 414 in accordance with an inspection result of the battery units 2 in the inspection station 408. Specifically, the battery units 2 passed by both the inspection devices 200, 300 are picked from each holder 414 by the picking device, and are disposed on a tray 418. The tray 418 is carried to a packaging and shipment station (not illustrated) for the battery units 2.

On the other hand, the battery unit 2 that is rejected in any of the inspection devices 200, 300 is picked from the holder 414 by the picking device, and eliminated without being disposed in the tray 418, and a proper process such as failure investigation is performed. The inspection device 300 and the inspection device 200 are switched and disposed in the inspection station 408, so that after the negative pressure inspection of the battery units 2 is performed, and thereafter electric inspection of the battery units 2 may be performed. The battery unit 2 that is rejected in the inspection device 300 or the inspection device 200 may not be inspected in the next inspection.

Hereinafter, a case in which the inspection system 400 is incorporated in a portion of a manufacturing system 500 for the battery units 2, and the battery units 2 are inspected in the manufacturing process will be described with reference to FIG. 25. The manufacturing system 500 includes an assembling station 502, a conveyor 504, a first picking station 506, an inspection station 508, a second picking station 510, and a packaging and shipment station 512.

Figure 24:
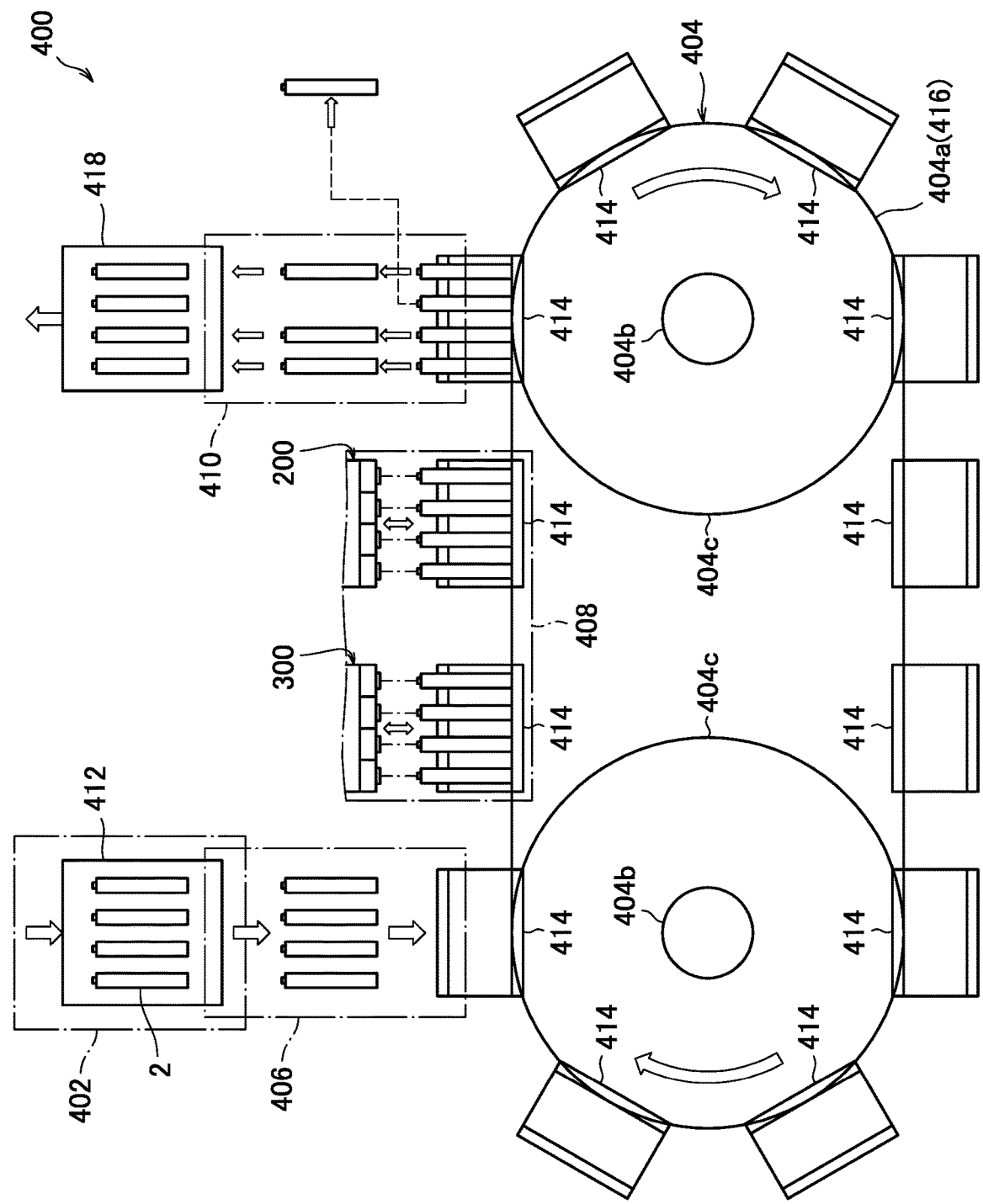
FIG. 24 is a configuration diagram of an inspection system according to a fourth embodiment of the present invention.
Figure 25:
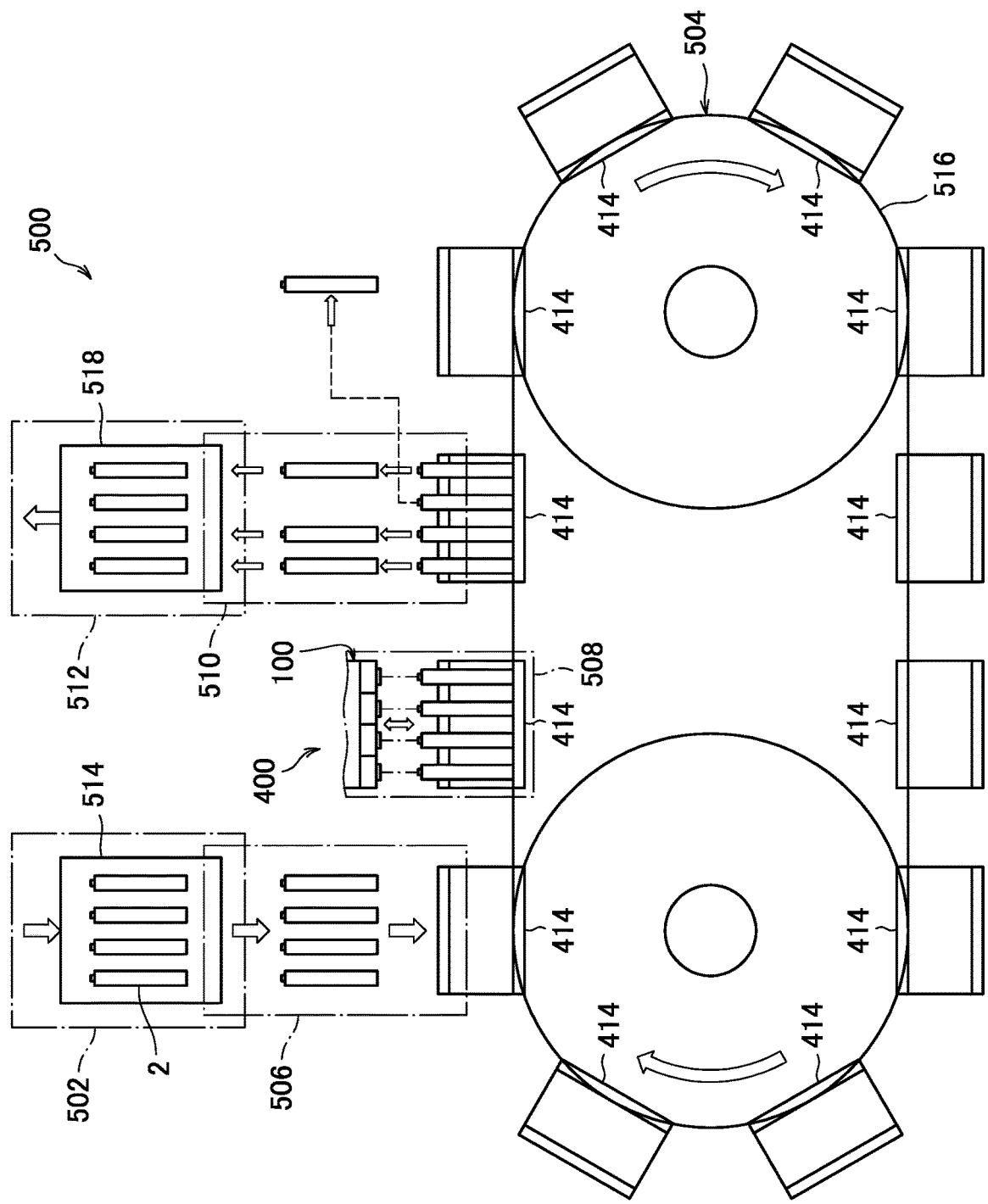
FIG. 25 is a configuration diagram of an inspection system according to a modification of the fourth embodiment.

Description of configurations similar to those in the case of FIG. 24 will be omitted, and particularly configurations of the conveyor 504, and the first and second picking stations 506, 510 illustrated in FIG. 25 are similar to the configurations of the conveyor 404, and the first and second picking stations 406, 410 illustrated in FIG. 24, and therefore detailed description will be omitted.

In the assembling station 502, each battery unit 2 is assembled, and the four battery units 2 after assembly completion are disposed on a tray 514.

The conveyor 504 sequentially and intermittently carries the holders 414 to the stations 502, 506, 508, 510 along an annular carrier path 516 in the arrow direction.

A picking device (not illustrated) of the first picking station 506 picks the battery units 2 disposed on the tray 512 to store the picked battery unit 2 in each holder 414 sequentially carried. In the inspection station 508, the inspection device 100 described in the first embodiment is disposed in place of the inspection devices 200, 300, and negative pressure and electric inspection for the battery units 2 are collectively performed by the inspection device 100.

A picking device (not illustrated) of the second picking station 510 picks and carries out the battery units 2 from each holder 414 in accordance with an inspection result of the battery units 2 in the inspection station 508. Specifically, the battery units 2 passed by the inspection device 100 are picked from each holder 414 by the picking device, and are disposed on a tray 518. The tray 518 is carried to an assembling and packaging station 512 for the battery units 2.

In the assembling and packaging station 512, each battery unit 2 is assembled as the smoking article 1, or the battery units 2 or the smoking articles 1 are packed, and shipment of these is prepared. On the other hand, the battery unit 2 that is rejected in the inspection device 100 is picked from the holder 414 by the picking device, and eliminated without being disposed in the tray 518, and a proper process such as failure investigation is performed. The inspection device 200 or the inspection device 300, or both the inspection devices 200, 300 may be disposed in the inspection station 508 in place of the inspection device 100.

As described above, the inspection system 400 of this embodiment can smoothly inspect each battery unit 2 in at least any of the inspection devices 100, 200, 300 while moving the battery units 2 to each of the stations by the conveyor 404, 504, and further suitably moving and selecting the battery units by the picking device. Accordingly, it is possible to further improve the inspection efficiency and the inspection precision of battery units 2. The inspection system 400 is incorporated in the manufacturing system 500, so that it is possible to further improve not only production efficiency of the battery units 2 but also production efficiency of the smoking articles 1.

The description of each embodiment of the present invention is now completed. However, the present invention is not limited to these, various changes can be performed without departing from the spirit of the present invention.

For example, in each embodiment, the smoking article 1 is composed of the battery unit 2, the atomizer unit 4, and the capsule unit 6. However, the present invention is not limited to this, the inspection devices 100, 200, 300, and the inspection system 400 each can be applicable to inspection for battery units 2 of smoking articles 1 composed of only a battery unit 2 and an atomizer unit 4.

EXPLANATION OF REFERENCE SIGNS 1 smoking article
2 battery unit
8 battery
10 pressure sensor (suction detection part)
14 LED (light-emitting device)
28 electric terminal 44 suction path
44b merging part
46 adapter
50 massflow controller (rate controller)
52 vacuum pump (suction source)
54 optical sensor
56 control unit (reset function)
57 fixing base (connection mechanism)
60 slider (connection mechanism)
62 clamp (connection mechanism)
66 inspection terminal
68 outer terminal (first terminal)
68b through hole (pressure adjustment mechanism, communication part)
70 inner terminal (second terminal)
78 suction port
78a cutout (pressure adjustment mechanism, communication part)
82 seal part
100, 200 inspection device
300 inspection device (second inspection device)
400 inspection system

The invention claimed is:

1. A battery unit inspection device being an inspection device for a battery unit for a smoking article having a battery embedded therein, the battery unit including a suction detection part that detects negative pressure in the battery unit, the inspection device comprising:
a suction path being connected to the suction detection part through a suction port;
a suction source disposed in the suction path; and
a control unit that inspects operation of the battery unit on the basis of the negative pressure detected by the suction detection part, by operating the suction source to suck the suction detection part through the suction path.

2. The battery unit inspection device according to claim 1, the battery unit including an electric terminal electrically connected to the battery, the inspection device comprising:
an inspection terminal being electrically connected to the electric terminal,
wherein the inspection terminal is electrically connected to the control unit.

3. The battery unit inspection device according to claim 2, wherein the suction port forms one portion of the inspection terminal.

4. The battery unit inspection device according to claim 2, further comprising:
an adapter that includes the inspection terminal and the suction port, and is connected to the battery unit at a time of inspection of the battery unit.

5. The battery unit inspection device according to claim 4, wherein the inspection terminal is composed of a first terminal that comes into contact with one electrode of the electric terminal when the battery unit is connected to the adapter, and a second terminal that comes into contact with another electrode of the electric terminal when the battery unit is connected to the adapter, and that forms the suction port.

6. The battery unit inspection device according to claim 5, wherein the adapter has a seal part between the first terminal and the second terminal, the seal part being to come into contact with the battery unit.

7. The battery unit inspection device according to claim 4, wherein a plurality of the adapters are provided,
wherein a plurality of the suction paths are provided for the plurality of adapters,
wherein the single suction source is disposed in a merging part of each of the suction paths, and
wherein the control unit inspects operation of a plurality of the battery units at the same time.

8. The battery unit inspection device according to claim 7, further comprising:
a slider that detachably holds the plurality of battery units with postures directing the respective electric terminals of the battery units at the same time;
a fixing base that fixes the plurality of adapters with postures in which the inspection terminals and the suction ports of the adapters face the respective electric terminals; and
a connection mechanism that slides the slider in axial directions of the battery units, collectively communicates the suction detection parts of the battery units with the respective suction paths of the inspection device, and collectively connects the electric terminals of the battery units to the respective inspection terminals of the inspection device.

9. The battery unit inspection device according to claim 1, wherein the suction path has a rate controller that adjusts a suction flow rate of the suction path, between the suction port and the suction source.

10. The battery unit inspection device according to claim 2, wherein the suction path has a pressure adjustment mechanism that adjusts pressure in the suction path.

11. The battery unit inspection device according to claim 10, wherein the inspection terminal has a communication part that communicates the suction path with outside of the suction path, and
wherein the pressure adjustment mechanism adjusts, through the communication part, the negative pressure in the suction path when the suction source is operated.

12. The battery unit inspection device according to claim 1, wherein the control unit inspects at least any one of a leakage current of each of the battery units, and charging capability, behavior at a time of a short circuit, resistance, output voltage, and output time, and a negative pressure detection mode by the suction detection part.

13. The battery unit inspection device according to claim 12, wherein the negative pressure detection mode by the suction detection part includes detection of ventilation resistance of the suction path.

14. The battery unit inspection device according to claim 1, the battery unit further including a light-emitting device that emits light on the basis of the negative pressure detected by the suction detection part, the inspection device further comprising:
an optical sensor that detects a light emission mode of the light-emitting device,
wherein the control unit inspects the light emission mode of the light-emitting device, detected by the optical sensor.

15. The battery unit inspection device according to claim 1, wherein the control unit has a reset function of resetting a frequency of detection of the negative pressure detected by the suction detection part, and inspects operation of the reset function.

16. A battery unit inspection system comprising the inspection device according to claim 1, the battery unit inspection system comprising:
a carrying-in station in which a tray on which a plurality of the battery units are disposed is carried;
a conveyor that carries a holder for storing the battery units;

a first picking station that picks the battery units disposed on the tray, and stores the picked battery units in the holder;

an inspection station that connects the inspection device to the battery units stored in the holder during carrying by the conveyor, and collectively inspects the battery units every holder; and a second picking station that picks and carries out the battery units from the holder in accordance with an inspection result of the battery units in the inspection station.

17. The battery unit inspection device according to claim 1, wherein the inspection device has an adapter that includes the suction port, and is connected to the battery unit at a time of inspection of the battery unit.

18. The battery unit inspection device according to claim 17, wherein a plurality of the adapters are provided,
wherein a plurality of the suction paths are provided for the plurality of adapters,
wherein the single suction source is disposed in a merging part of each of the suction paths, and
wherein the inspection device inspects operation of a plurality of the battery units through the respective adapters at the same time.

19. The battery unit inspection device according to claim 18, further comprising:
a slider that detachably holds the plurality of battery units;
a fixing base that fixes the plurality of adapters with postures in which the suction ports of the adapters face the respective battery units; and
a connection mechanism that slides the slider in axial directions of the battery units, and collectively communicates the suction detection parts of the battery units with the respective suction paths.

20. The battery unit inspection device according to claim 17, wherein the suction paths each have a rate controller that adjusts a suction flow rate of the suction path, between the suction port and the suction source.

21. The battery unit inspection device according to claim 17, wherein the suction paths each have a pressure adjustment mechanism that adjusts pressure in the suction path.

22. The battery unit inspection device according to claim 21, wherein the adapters each have a communication part that communicates the suction path with outside of the suction path, and
wherein the pressure adjustment mechanism adjusts, through the communication part, the negative pressure in the suction path when the suction source is operated.

23. The battery unit inspection device according to claim 17, wherein the inspection device inspects ventilation resistance of the suction path as a negative pressure detection mode by the suction detection part.

24. The battery unit inspection device according to claim 17, the battery unit further including a light-emitting device that emits light on the basis of the negative pressure detected by the suction detection part, the inspection device further comprising:
an optical sensor that detects a light emission mode of the light-emitting device,
wherein the optical sensor inspects the light emission mode of the light-emitting device, detected by the optical sensor.

25. The battery unit inspection device according to claim 17, wherein the inspection device has a reset function of resetting a frequency of detection of the negative pressure detected by the suction detection part, and inspects operation of the reset function.

26. A battery unit inspection system comprising the inspection device according to claim 1, the battery unit including an electric terminal electrically connected to the battery, the inspection system further comprising:
a second inspection device having an inspection terminal being electrically connected to the electric terminal,
wherein the second inspection device includes a second control unit that inspects operation of the battery unit through the inspection terminal.

27. The battery unit inspection system according to claim 26, wherein the second inspection device includes a second adapter including the inspection terminal, and being connected to the battery unit at a time of inspection of the battery unit.

28. The battery unit inspection system according to claim 27, wherein the inspection terminal is composed of a first terminal that comes into contact with one electrode of the electric terminal when the battery unit is connected to the second adapter, and a second terminal that comes into contact with another electrode of the electric terminal when the battery unit is connected to the second adapter.

29. The battery unit inspection system according to claim 28, wherein the second adapter has a seal part between the first terminal and the second terminal, the seal part being to come into contact with the battery unit.

30. The battery unit inspection system according to claim 26, wherein a plurality of the second adapters are provided, and
wherein the second control unit inspects operation of a plurality of the battery units through the second adapters at the same time.

31. The battery unit inspection system according to claim 30, further comprising:
a second slider that detachably holds the plurality of battery units with postures directing the electric terminals of the respective battery units in the same direction;
a second fixing base that fixes the second adapters with respective postures in which the inspection terminals of the plurality of second adapters face the electric terminals; and
a second connection mechanism that slides the second slider in axial directions of the battery units, and collectively connects of the electric terminals of the battery units to the respective inspection terminals.

32. The battery unit inspection system according to claim 26, wherein the second control unit inspects at least one of a leakage current of the battery unit, and charging capability, behavior at the time of a short circuit, resistance, output voltage, and output time.

33. The battery unit inspection system according to claim 26, comprising:
a carrying-in station in which a tray on which a plurality of the battery units are disposed is carried;
a conveyor that carries a holder for storing the battery units;
a first picking station that picks the battery units disposed on the tray, and stores the picked battery units in the holder;
an inspection station that connects at least any of the inspection device and the second inspection device to the battery units stored in the holder during carrying by the conveyor, and collectively inspects the battery units every holder; and a second picking station that picks and carries out the battery units from the holder in accordance with an inspection result of the battery units in the inspection station.

* * * * *